(12) United States Patent
Yamazaki

(10) Patent No.: US 9,570,623 B2
(45) Date of Patent: Feb. 14, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/518,126

(22) Filed: Oct. 20, 2014

(65) Prior Publication Data
US 2015/0053977 A1    Feb. 26, 2015

Related U.S. Application Data

(63) Continuation of application No. 13/330,821, filed on Dec. 20, 2011, now Pat. No. 8,883,556.

(30) Foreign Application Priority Data

Dec. 28, 2010    (JP) ................................. 2010-293047

(51) Int. Cl.
*H01L 29/10* (2006.01)
*H01L 29/12* (2006.01)
(Continued)

(52) U.S. Cl.
CPC ......... *H01L 29/7869* (2013.01); *G11C 11/403* (2013.01); *H01L 27/10873* (2013.01);
(Continued)

(58) Field of Classification Search
CPC ........... H01L 29/7869; H01L 29/78618; H01L 29/78693; H01L 29/78696
(Continued)

(56) References Cited

U.S. PATENT DOCUMENTS 5,528,032 A    6/1996    Uchiyama
5,731,856 A    3/1998    Kim et al.
(Continued)

FOREIGN PATENT DOCUMENTS

CN    101582453 A    11/2009
CN    101719514 A    6/2010
(Continued)

OTHER PUBLICATIONS

Kim et. Al. ((Effect of indium composition ratio on solution-processed nanocrystalline InGaZnO thin film transistors; Kim, Gun Hee and Du Ahn, Byung and Shin, Hyun Soo and Jeong, Woong Hee and Kim, Hee Jin and Kim, Hyun Jae, Applied Physics Letters, 94, 233501 (2009)), previously cited hereinafter Kim).*

(Continued)

*Primary Examiner* — Fernando L Toledo
*Assistant Examiner* — Aaron Gray
(74) *Attorney, Agent, or Firm* — Eric J. Robinson; Robinson Intellectual Property Law Office, P.C.

(57) ABSTRACT

A semiconductor device capable of high speed operation is provided. Further, a semiconductor device in which change in electric characteristics due to a short channel effect is hardly caused is provided. An oxide semiconductor having crystallinity is used for a semiconductor layer of a transistor. A channel formation region, a source region, and a drain region are formed in the semiconductor layer. The source region and the drain region are formed by self-aligned process in which one or more elements selected from Group 15 elements are added to the semiconductor layer with the use of a gate electrode as a mask. The source region and the drain region can have a wurtzite crystal structure.

20 Claims, 18 Drawing Sheets

(51) Int. Cl.

| | | |
|---|---|---|
| *H01L 29/04* | (2006.01) | |
| *H01L 31/036* | (2006.01) | |
| *H01L 29/76* | (2006.01) | |
| *H01L 31/112* | (2006.01) | |
| *H01L 21/00* | (2006.01) | |
| *H01L 21/16* | (2006.01) | |
| *H01L 21/336* | (2006.01) | |
| *H01L 29/786* | (2006.01) | |
| *H01L 27/108* | (2006.01) | |
| *H01L 27/11* | (2006.01) | |
| *H01L 27/115* | (2006.01) | |
| *H01L 27/12* | (2006.01) | |
| *G11C 11/403* | (2006.01) | |
| *H01L 29/24* | (2006.01) | |
| *H01L 21/02* | (2006.01) | |
| *G11C 16/04* | (2006.01) | |

(52) U.S. Cl.
CPC ...... *H01L 27/1108* (2013.01); *H01L 27/1156* (2013.01); *H01L 27/1203* (2013.01); *H01L 29/24* (2013.01); *H01L 29/78618* (2013.01); *H01L 29/78696* (2013.01); *G11C 16/0433* (2013.01); *H01L 21/02554* (2013.01); *H01L 21/02565* (2013.01); *H01L 21/02631* (2013.01); *H01L 29/78693* (2013.01)

(58) Field of Classification Search
USPC ........ 257/43, 49, 66, E92.296; 438/104, 301
See application file for complete search history.

(56) References Cited

U.S. PATENT DOCUMENTS

| | | |
|---|---|---|
| 5,744,864 A | 4/1998 | Cillessen et al. |
| 5,817,548 A | 10/1998 | Noguchi et al. |
| 5,943,593 A | 8/1999 | Noguchi et al. |
| 6,087,679 A | 7/2000 | Yamazaki et al. |
| 6,294,274 B1 | 9/2001 | Kawazoe et al. |
| 6,563,174 B2 | 5/2003 | Kawasaki et al. |
| 6,674,098 B1 | 1/2004 | Niki et al. |
| 6,727,522 B1 | 4/2004 | Kawasaki et al. |
| 6,878,962 B1 | 4/2005 | Kawasaki et al. |
| 6,987,029 B2 | 1/2006 | Niki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,205,640 B2 | 4/2007 | Yoshioka et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,605,012 B2 | 10/2009 | Niki et al. |
| 7,674,650 B2 | 3/2010 | Akimoto et al. |
| 7,732,819 B2 | 6/2010 | Akimoto et al. |
| 7,993,964 B2 | 8/2011 | Hirao et al. |
| 8,003,981 B2 | 8/2011 | Iwasaki et al. |
| 8,093,589 B2 | 1/2012 | Sugihara et al. |
| 8,202,365 B2 | 6/2012 | Umeda et al. |
| 8,329,506 B2 | 12/2012 | Akimoto et al. |
| 8,334,532 B2 | 12/2012 | Umeda et al. |
| 8,378,341 B2 | 2/2013 | Hayashi et al. |
| 8,415,665 B2 | 4/2013 | Kimura et al. |
| 8,643,011 B2 | 2/2014 | Akimoto et al. |
| 8,890,146 B2 | 11/2014 | Kimura et al. |
| 9,171,868 B2 | 10/2015 | Kimura et al. |
| 9,252,288 B2 | 2/2016 | Akimoto et al. |
| 9,349,757 B2 | 5/2016 | Kimura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0173734 A1 | 8/2005 | Yoshioka et al. |
| 2005/0199959 A1 | 9/2005 | Chiang et al. |
| 2006/0035452 A1 | 2/2006 | Carcia et al. |
| 2006/0038242 A1 | 2/2006 | Hsu et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0270175 A1 | 11/2006 | Aoki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0116500 A1 | 5/2008 | Tokunaga |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277656 A1 | 11/2008 | Park et al. |
| 2008/0296568 A1 | 12/2008 | Ryu et al. |
| 2009/0008645 A1 | 1/2009 | Yamazaki et al. |
| 2009/0057674 A1* | 3/2009 | Jeong et al. .................. 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |

(56) References Cited

U.S. PATENT DOCUMENTS

| | | |
|---|---|---|
| 2009/0152506 A1 | 6/2009 | Umeda et al. |
| 2009/0152541 A1 | 6/2009 | Maekawa et al. |
| 2009/0200545 A1 | 8/2009 | Nakahara et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0051936 A1* | 3/2010 | Hayashi et al. ............ 257/43 |
| 2010/0065844 A1 | 3/2010 | Tokunaga |
| 2010/0084655 A1* | 4/2010 | Iwasaki et al. ............ 257/43 |
| 2010/0092800 A1 | 4/2010 | Itagaki et al. |
| 2010/0102309 A1 | 4/2010 | Nakahara et al. |
| 2010/0109002 A1 | 5/2010 | Itagaki et al. |
| 2010/0117073 A1 | 5/2010 | Yamazaki et al. |
| 2010/0159639 A1 | 6/2010 | Sakata |
| 2010/0224871 A1 | 9/2010 | Yamaguchi et al. |
| 2011/0147738 A1 | 6/2011 | Yamazaki et al. |
| 2011/0175090 A1 | 7/2011 | Sugihara et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2013/0134418 A1 | 5/2013 | Hayashi et al. |
| 2016/0111282 A1 | 4/2016 | Akimoto et al. |

FOREIGN PATENT DOCUMENTS

| | | |
|---|---|---|
| EP | 1199755 A | 4/2002 |
| EP | 1209748 A | 5/2002 |
| EP | 1443130 A | 8/2004 |
| EP | 1737044 A | 12/2006 |
| EP | 1912298 A | 4/2008 |
| EP | 2120267 A | 11/2009 |
| EP | 2175493 A | 4/2010 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-043122 A | 2/1994 |
| JP | 06-275697 A | 9/1994 |
| JP | 08-264794 A | 10/1996 |
| JP | 11-505377 | 5/1999 |
| JP | 11-213763 A | 8/1999 |
| JP | 2000-044236 A | 2/2000 |
| JP | 2000-150900 A | 5/2000 |
| JP | 2001-044500 A | 2/2001 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2003-273400 A | 9/2003 |
| JP | 2004-103957 A | 4/2004 |
| JP | 2004-273614 A | 9/2004 |
| JP | 2004-273732 A | 9/2004 |
| JP | 2005-340370 A | 12/2005 |
| JP | 2007-096055 A | 4/2007 |
| JP | 2007-123861 A | 5/2007 |
| JP | 2007-220816 A | 8/2007 |
| JP | 2008-277665 A | 11/2008 |
| JP | 2009-135350 A | 6/2009 |
| JP | 2009-147192 A | 7/2009 |
| JP | 2009-167087 A | 7/2009 |
| JP | 2009-278115 A | 11/2009 |
| JP | 2010-040552 A | 2/2010 |
| JP | 2010-093070 A | 4/2010 |
| JP | 2010-135774 A | 6/2010 |
| JP | 2010-141230 A | 6/2010 |
| JP | 2010-153802 A | 7/2010 |
| JP | 2010-202454 A | 9/2010 |
| JP | 2011-001249 A | 1/2011 |
| JP | 2011-141543 A | 7/2011 |
| JP | 2011-146694 A | 7/2011 |
| KR | 2009-0119666 A | 11/2009 |
| KR | 2010-0039806 A | 4/2010 |
| WO | WO-2004/114391 | 12/2004 |
| WO | WO-2007/142167 | 12/2007 |
| WO | WO-2011/070929 | 6/2011 |
| WO | WO-2011/074407 | 6/2011 |

OTHER PUBLICATIONS

Ohtomo et. Al. ((A. Ohtomo, K. Tamura, K. Saikusa, K. Takahashi, T. Makino, Y. Segawa, H. Koinuma and M. Kawasaki; Single crystalline ZnO films grown on lattice-matched ScAlMgO4(0001) substrates; Appl. Phys. Lett. 75, p. 2635 (1999)) previously cited hereinafter Ohtomo).*

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.

Ahn.B et al., "Comparison of the effects of Ar and H2 plasmas on the performance of homojunctioned amorphous indium gallium zinc oxide thin film transistors", Appl. Phys. Lett. (Applied Physics Letters) , 2008, vol. 93, No. 20, pp. 203506-1-203506-3.

Coates.D et al., "Optical Studies of the Amorphous Liquid-Cholesteric Liquid Crystal Transition:The "Blue Phase"", Physics Lettters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGA2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest 09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al.; "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

International Search Report (Application No. PCT/JP2011/080141) Dated Mar. 27, 2012.

Written Opinion (Application No. PCT/JP2011/080141) Dated Mar. 27, 2012.

Ohtomo.A et al., "Single crystalline ZnO films grown on lattice-matched ScAlMgO4 (0001) substrates", Appl. Phys. Lett. (Applied Physics Letters), Oct. 25, 1999, vol. 75, No. 17, pp. 2635-2637.

Lin.C et al., "Properties of nitrogen-implanted p-type ZnO films grown on Si3N4/Si by radio-frequency magnetron sputtering", Appl. Phys. Lett. (Applied Physics Letters), Jun. 14, 2004, vol. 84, No. 24, pp. 5040-5042.

Taiwanese Office Action (Application No. 100148629) Dated Aug. 24, 2015.

* cited by examiner

170

180

● In
○ Sn
○ Zn
• O

● In
○ Ga
○ Zn
● O

SEMICONDUCTOR DEVICE AND MANUFACTURING METHOD THEREOF

TECHNICAL FIELD

The present invention relates to a semiconductor device which includes a circuit including a semiconductor element such as a transistor, and a method for manufacturing the semiconductor device. For example, the present invention relates to an electronic device which includes, as a component, a power device mounted on a power supply circuit; a semiconductor integrated circuit including a memory, a thyristor, a converter, an image sensor, or the like; an electro-optical device typified by a liquid crystal display panel; a light-emitting display device including a light-emitting element; or the like.

Note that in this specification, a semiconductor device means any device that can function by utilizing semiconductor characteristics. An electro-optical device, a light-emitting display device, a semiconductor circuit, and an electronic device are all semiconductor devices.

BACKGROUND ART

A transistor formed over a glass substrate or the like is manufactured using amorphous silicon, polycrystalline silicon, or the like, as typically seen in a liquid crystal display device. Although a transistor including amorphous silicon has low field-effect mobility, it can be formed over a larger glass substrate. On the other hand, although a transistor including polycrystalline silicon has high field-effect mobility, it is not suitable for being formed over a larger glass substrate.

In view of the foregoing, attention has been drawn to a technique by which a transistor is manufactured using an oxide semiconductor, and such a transistor is applied to an electronic device an optical device. For example, Patent Document 1 and Patent Document 2 disclose a technique in which a transistor is manufactured using zinc oxide or an In—Ga—Zn-based oxide as an oxide semiconductor and such a transistor is used as a switching element or the like of a pixel of a display device.

Patent Document 3 discloses a technique in which in a staggered transistor including an oxide semiconductor, a highly conductive oxide semiconductor including nitrogen is provided as buffer layers between a source region and a source electrode and between a drain region and a drain electrode, and thereby the contact resistance between the oxide semiconductor and the source electrode and between the oxide semiconductor and the drain electrode is reduced.

Further, as a method for forming a source region and a drain region of a transistor including an oxide semiconductor by a self-aligned process, Non-Patent Document 1 discloses a method in which a surface of an oxide semiconductor is exposed and argon plasma treatment is performed thereon for reducing resistivity of the exposed portion in the oxide semiconductor.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-135774

Non-Patent Document

[Non-Patent Document 1] S. Jeon et al., "180 nm Gate Length Amorphous InGaZnO Thin Film Transistor for High Density Image Sensor Application", IEDM Tech. Dig., p. 504, 2010.

DISCLOSURE OF INVENTION

An object is to provide a semiconductor device capable of high speed operation.

An object is to provide a semiconductor device in which variation in electric characteristics due to a short channel effect is less likely to be caused.

Further, an object is to provide a semiconductor device which can be easily miniaturized by formation of a source region and a drain region by a self-aligned process.

Further, an object is to provide a semiconductor device in which contact resistance between a source region and a source electrode and between a drain region and a drain electrode is reduced and on-state current is improved, by formation of the source region and the drain region each having resistance lower than that of a channel.

Further, an object is to provide a highly reliable semiconductor device.

An embodiment of the present invention is a semiconductor device including an oxide semiconductor layer having crystallinity, a gate insulating layer, and a gate electrode. The oxide semiconductor layer includes a first oxide semiconductor region and a pair of second oxide semiconductor regions. The first oxide semiconductor region is sandwiched between the pair of second oxide semiconductor regions. The first oxide semiconductor region overlaps with the gate electrode with the gate insulating layer interposed therebetween.

Further, an embodiment of the present invention is a semiconductor device including an oxide semiconductor layer having crystallinity, a gate insulating layer, and a gate electrode. The oxide semiconductor layer includes a first oxide semiconductor region, a pair of second oxide semiconductor regions, and a pair of third oxide semiconductor regions. The first oxide semiconductor region is sandwiched between the pair of third oxide semiconductor regions. The pair of third oxide semiconductor regions is sandwiched between the pair of second oxide semiconductor regions. The first oxide semiconductor region overlaps with the gate electrode with the gate insulating layer interposed therebetween.

A non-single-crystal semiconductor may be used for the oxide semiconductor layer.

The first oxide semiconductor region includes a c-axis aligned crystalline oxide semiconductor (CAAC-OS). The CAAC-OS includes crystal parts, in each of which a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis.

Each of the second oxide semiconductor regions may contain at least one of Group 15 elements at a concentration of higher than or equal to $5\times10^{19}$ atoms/cm$^3$ and lower than or equal to $1\times10^{22}$ atoms/cm$^3$. The second oxide semiconductor regions may have a wurtzite crystal structure.

Each of the third oxide semiconductor regions may contain at least one of Group 15 elements at a concentration of higher than or equal to $5\times10^{18}$ atoms/cm$^3$ and lower than or equal to $5\times10^{19}$ atoms/cm$^3$. The third oxide semiconductor regions may have a wurtzite crystal structure.

The second oxide semiconductor regions and the third oxide semiconductor regions can each have a crystal structure different from the first oxide semiconductor region. In this case, the oxide semiconductor layer included in the semiconductor device has a heterojunction. An oxide semiconductor having a heterojunction is used for a semiconductor layer of a transistor, whereby on-state current is expected to be increased. Further, off-state current is expected to be reduced.

The oxide semiconductor can contain two or more elements selected from In, Ga, Sn, and Zn.

The first oxide semiconductor region serves as a channel formation region of a transistor. The pair of second oxide semiconductor regions serves as a source region and a drain region of the transistor. The pair of third oxide semiconductor regions serves as low-concentration regions of the transistor.

In a top-gate transistor, a source region and a drain region can be formed by adding a dopant to an oxide semiconductor layer with the use of a gate electrode as a mask. The source region and the drain region are formed using the gate electrode as a mask, whereby the source region and the drain region do not overlap with the gate electrode and thus parasitic capacitance can be reduced. Since the parasitic capacitance can be reduced, the transistor can be operated at high speed.

In the case where low-concentration regions are formed between a channel formation region and a source region and between the channel formation region and a drain region in a top-gate transistor, first, a dopant for forming the low-concentration regions is added to an oxide semiconductor layer with the use of a gate electrode as a mask; then, sidewalls are formed on side surfaces of the gate electrode; finally, a dopant for forming the source region and the drain region is added to the oxide semiconductor layer with the use of the gate electrode and the sidewalls as masks.

In a bottom-gate transistor, a source region and a drain region can be formed by addition of a dopant to an oxide semiconductor layer with the use of a channel protective layer as a mask. The channel protective layer is formed to protect a back channel portion of an active layer, and is preferably formed using a single layer or a stacked layer using one or more of materials selected from silicon oxide, silicon nitride, aluminum oxide, aluminum nitride, and the like.

A dopant used for forming a source region, a drain region, and low-concentration regions of a transistor can be added by an ion doping method, an ion implantation method, or the like. As the dopant, one or more elements selected from Group 15 (Group 5B) elements such as nitrogen (N) or phosphorus (P) can be used. Further, the dopant is added to an oxide semiconductor layer through an insulating layer by an ion doping method or an ion implantation method, so that excessive damage to the oxide semiconductor layer in addition of the dopant can be reduced. Furthermore, the interface between the oxide semiconductor layer and the insulating layer is kept clean, so that characteristics and reliability of the transistor are improved. Moreover, the depth to which a dopant is added (addition region) is easily controlled, so that a dopant can be accurately added to an oxide semiconductor layer.

The carrier density of an oxide semiconductor region can be increased as the concentration of a dopant to be added is increased; however, carrier transfer is inhibited and the conductivity is decreased if the concentration of the dopant to be added is too high.

An oxide semiconductor to which a dopant is added is used for a source region and a drain region, whereby a curve of a band edge of a channel formation region to which the dopant is not added can be small. On the other hand, in the case where the source region and the drain region are formed using a metal material, a curve of the band edge of the channel which is the oxide semiconductor region is not negligible, so that the effective channel length is decreased in some cases. This tendency becomes more remarkable as the channel length of a transistor is reduced.

Oxide semiconductor regions to which a dopant is added are used for forming a source region and a drain region of a transistor, whereby on-state current of the transistor can be increased without an increase in off-state current of the transistor.

Further, the resistivity of the third oxide semiconductor regions is set higher than that of the second oxide semiconductor regions. The third oxide semiconductor regions are provided, whereby an electric field generated between the first oxide semiconductor region and the second oxide semiconductor regions can be relieved and degradation of transistor characteristics can be reduced. Further, negative shift of the threshold voltage due to a short channel effect can be reduced.

An oxide semiconductor which is purified (purified OS) by reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor) by supplying oxygen to the oxide semiconductor to reduce oxygen deficiency in the oxide semiconductor. Accordingly, a transistor including the i-type or substantially i-type oxide semiconductor in a semiconductor layer where a channel is formed has characteristics of very small off-state current. Specifically, the hydrogen concentration of the purified oxide semiconductor, which is measured by secondary ion mass spectrometry (SIMS), is lower than $5\times10^{18}$/cm$^3$, preferably lower than or equal to $1\times10^{18}$/cm$^3$, further preferably lower than or equal to $5\times10^{17}$/cm$^3$, still further preferably lower than or equal to $1\times10^{16}$/cm$^3$. In addition, the carrier density of the i-type or substantially i-type oxide semiconductor, which is measured by Hall effect measurement, is less than $1\times10^{14}$/cm$^3$, preferably less than $1\times10^{12}$/cm$^3$, further preferably less than $1\times10^{11}$/cm$^3$. Furthermore, the band gap of the oxide semiconductor is 2 eV or more, preferably 2.5 eV or more, more preferably 3 eV or more. With the use of the i-type or substantially i-type oxide semiconductor for a semiconductor layer where a channel is formed, off-state current of the transistor can be reduced.

The SIMS analysis of the hydrogen concentration in the oxide semiconductor is described here. It is known that it is difficult to obtain accurate data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

According to an embodiment of the present invention, a semiconductor device including an oxide semiconductor, which has favorable electric characteristics and is easily miniaturized, can be provided.

Further, a semiconductor device is provided in which variation in electric characteristics due to a short channel effect is not easily caused.

When a dopant is added to an oxide semiconductor through an insulating layer, the oxide semiconductor is prevented from being thinned and the interface between the oxide semiconductor and the insulating layer is kept clean, so that characteristics and reliability of a semiconductor device can be increased.

BRIEF DESCRIPTION OF DRAWINGS

In the accompanying drawings.

BEST MODE FOR CARRYING OUT THE INVENTION

Figure 1A:
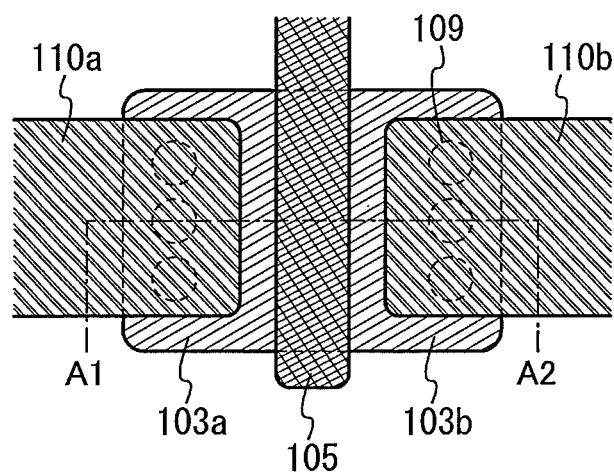
FIGS. 1A and 1B are a top view and a cross-sectional view illustrating an embodiment of the present invention.

Embodiments of the present invention will be described below with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the present invention described hereinafter, the same portions or portions having similar functions are denoted by the same reference numerals in different drawings, and description thereof is not repeated.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Note that terms such as "first", "second", and "third" in this specification are used in order to avoid confusion among components, and the terms do not limit the components numerically. Therefore, for example, the term "first" can be replaced with the term "second", "third", or the like as appropriate.

A transistor is one mode of a semiconductor device and can achieve amplification of current or voltage, a switching operation for controlling conduction or non-conduction, or the like. A transistor in this specification includes an insulated-gate field effect transistor (IGFET) and a thin film transistor (TFT).

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

(Embodiment 1)

In this embodiment, a transistor in which an oxide semiconductor is used for a channel and a manufacturing method thereof will be described with reference to FIGS. 1A and 1B, FIGS. 2A and 2B, FIGS. 3A to 3D, and FIGS. 4A and 4B.

Figure 1B:
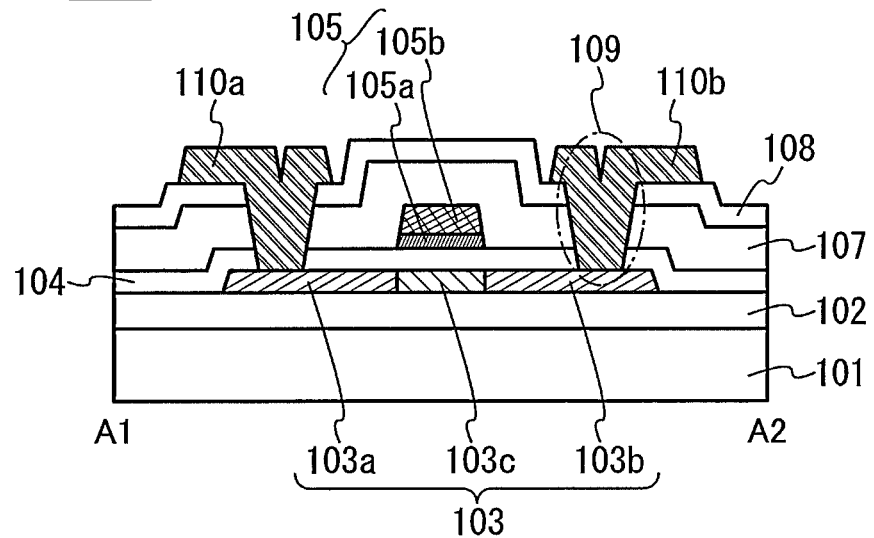

FIG. 1A is a top view illustrating a structure of a transistor 100 which is one mode of a structure of a semiconductor device, and FIG. 1B is a cross-sectional view illustrating a cross-sectional structure of a portion indicated by a chain line A1-A2 in FIG. 1A. In FIG. 1A, a substrate and an insulating layer are omitted.

In the transistor 100 illustrated in FIGS. 1A and 1B, a base layer 102 is formed over a substrate 101, and an oxide semiconductor layer 103 is formed over the base layer 102. A gate insulating layer 104 is formed over the oxide semiconductor layer 103, and a gate electrode 105 is formed over the gate insulating layer 104. An insulating layer 107 and an insulating layer 108 are formed over the gate electrode 105, and a source electrode 110a and a drain electrode 110b are formed over the insulating layer 108. The source electrode 110a and the drain electrode 110b are electrically connected to the oxide semiconductor layer 103 through contact holes 109 provided in the gate insulating layer 104, the insulating layer 107, and the insulating layer 108.

The oxide semiconductor layer 103 includes a channel formation region 103c which overlaps with the gate electrode 105 with the gate insulating layer 104 interposed therebetween, a source region 103a which is electrically connected to the source electrode 110a, and a drain region 103b which is electrically connected to the drain electrode 110b.

Further, the gate electrode 105 includes a gate electrode 105a which is in contact with the gate insulating layer 104 and a gate electrode 105b which is stacked over the gate electrode 105a.

Although FIG. 1A illustrates an example in which a plurality of the contact holes 109 is provided over each of the source region 103a and the drain region 103b, only one contact hole 109 may be provided over each of the source region 103a and the drain region 103b. Further, it is preferable that the size of the contact hole 109 be as large as possible and the number of the contact holes 109 be large in order to reduce contact resistance between the source electrode 110a and the source region 103a and contact resistance between the drain electrode 110b and the drain region 103b.

Figure 2A:
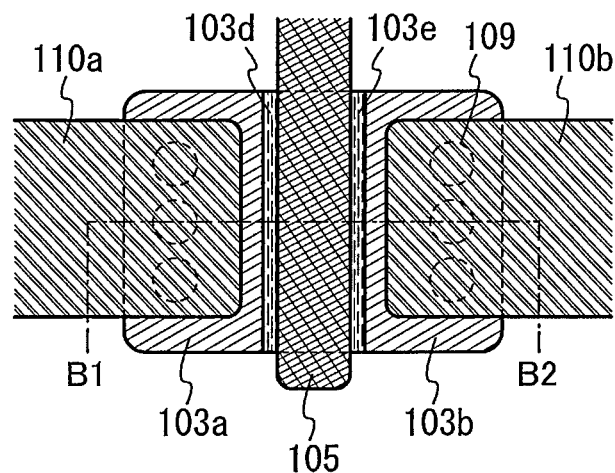
FIGS. 2A and 2B are a top view and a cross-sectional view illustrating an embodiment of the present invention.
Figure 2B:
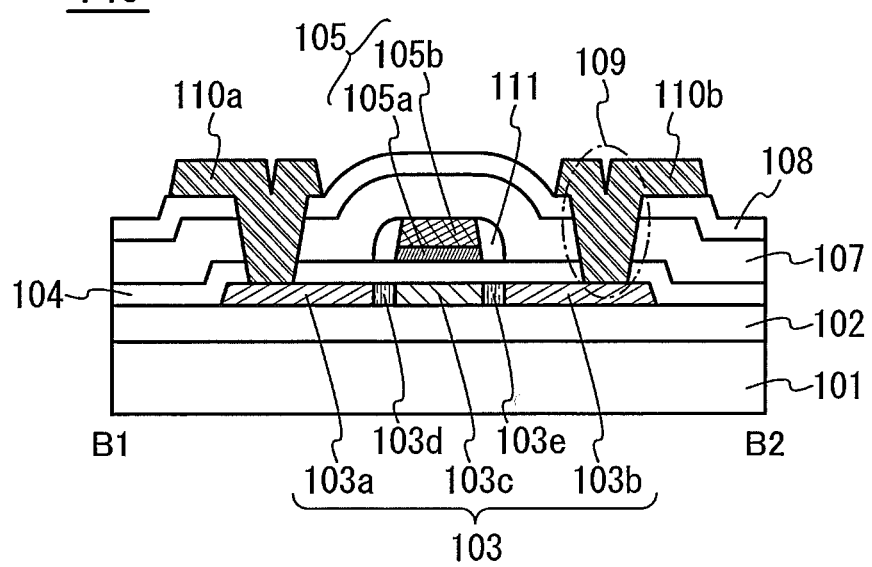

A transistor 140 illustrated in FIGS. 2A and 2B includes, in addition to the structure of the transistor 100, sidewalls 111 on side surfaces of the gate electrode 105 and a low-concentration region 103d and a low-concentration region 103e in regions of the oxide semiconductor layer 103, which overlap with the sidewalls 111. The low-concentration region 103d is formed between the channel formation region 103c and the source region 103a, and the low-concentration region 103e is formed between the channel formation region 103c and the drain region 103b. FIG. 2A is a top view illustrating the structure of the transistor 140 and FIG. 2B is a cross-sectional view illustrating a stacked structure of a portion indicated by a chain line B1-B2 in FIG. 2A.

The low-concentration region 103d and the low-concentration region 103e are provided, whereby deterioration of transistor characteristics and the negative shift in threshold voltage due to a short channel effect can be reduced.

Each of the transistor 100 and the transistor 140 is one mode of a top-gate transistor.

Next, a method for manufacturing the transistor 100 illustrated in FIGS. 1A and 1B will be described with reference to FIGS. 3A to 3D and FIGS. 4A and 4B. Note that FIGS. 3A to 3D and FIGS. 4A and 4B are cross-sectional views of the portion indicated by the chain line A1-A2 in FIG. 1A.

First, the base layer 102 is formed with a thickness of greater than or equal to 50 nm and less than or equal to 300 nm, preferably greater than or equal to 100 nm and less than or equal to 200 nm over the substrate 101. As the substrate 101, a glass substrate, a ceramic substrate, a plastic substrate that has high heat resistance enough to withstand a process temperature of this manufacturing process, or the like can be used. In the case where a substrate does not need a light-transmitting property, a metal substrate such as a stainless alloy, whose surface is provided with an insulating layer, may be used. As the glass substrate, for example, an alkali-free glass substrate of barium borosilicate glass, alumino-borosilicate glass, aluminosilicate glass, or the like may be used. Alternatively, a quartz substrate, a sapphire substrate, or the like can be used. Further alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates further provided with a semiconductor element may be used as the substrate 101.

The base layer 102 can be formed using a signal layer or a stacked layer using one or more of materials selected from aluminum nitride, aluminum oxide, aluminum nitride oxide, aluminum oxynitride, silicon nitride, silicon oxide, silicon nitride oxide, and silicon oxynitride. The base layer 102 has a function of preventing diffusion of an impurity element from the substrate 101. Note that in this specification, a nitride oxide is a substance which includes more nitrogen than oxygen, and an oxynitride is a substance which includes more oxygen than nitrogen. Note that content of each element can be measured by Rutherford backscattering spectrometry (RBS) or the like, for example.

The base layer 102 can be formed by a sputtering method, a CVD method, a coating method, a printing method, or the like as appropriate. In this embodiment, a stack of layers of silicon nitride and silicon oxide is used as the base layer 102. Specifically, a 50-nm-thick silicon nitride layer is formed over the substrate 101, and a 150-nm-thick silicon oxide layer is formed over the silicon nitride layer. Note that the base layer 102 may be doped with phosphorus (P) or boron (B).

When a halogen element such as chlorine or fluorine is contained in the base layer 102, a function of preventing diffusion of an impurity element from the substrate 101 can be further improved. The concentration of a halogen element to be contained in the base layer 102 is measured by secondary ion mass spectrometry (SIMS) and its peak is preferably greater than or equal to $1\times10^{15}/cm^3$ and less than or equal to $1\times10^{20}/cm^3$.

The base layer 102 may be formed using a material from which oxygen is released by heating. "Oxygen is released by heating" means that the amount of released oxygen which is converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS).

Here, a method in which the amount of released oxygen is measured by being converted into oxygen atoms using TDS analysis will be described below.

The amount of released gas in TDS analysis is proportional to the integral value of a spectrum. Therefore, the amount of released gas can be calculated from the ratio between the integral value of spectrum of the insulating layer and the reference value of a standard sample. The reference value of a standard sample refers to the ratio of the density of a predetermined atom contained in a sample to the integral value of a spectrum.

For example, the number of the released oxygen molecules ($N_{O2}$) from an insulating layer can be found according to Equation 1 with the TDS analysis results of a silicon wafer containing hydrogen at a predetermined density which is the standard sample and the TDS analysis results of the insulating layer. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \qquad \text{(Equation 1)}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating layer is subjected to TDS analysis. $\alpha$ is a coefficient which influences spectrum intensity in TDS analysis. Refer to Japanese Published Patent Application No. H6-275697 for details of Equation 1. Note that the amount of released oxygen from the above insulating layer is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the oxide insulating layer, the amount of released oxygen when converted into oxygen atoms is twice the number of the released oxygen molecules.

In the above structure, the insulating layer from which oxygen is released by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied to the semiconductor from the base layer, so that the interface state between the base layer and the oxide semiconductor can be reduced. As a result, charge or the like, which is generated due to the operation of the transistor or the like, can be prevented from being trapped at the interface between the base layer and the oxide semiconductor, so that the transistor with little degradation of electric characteristics can be obtained.

Further, in some cases, charge is generated due to oxygen deficiency in the oxide semiconductor. In general, part of oxygen deficiency in an oxide semiconductor serves as a donor to generate an electron which is a carrier. As a result, the threshold voltage of a transistor shifts in the negative direction. This tendency occurs remarkably in an oxygen deficiency caused on the back channel side. Note that a back channel in this specification refers to the vicinity of an interface of the base layer in the oxide semiconductor. Sufficient release of oxygen from the base layer to the oxide semiconductor can compensate oxygen deficiency in the oxide semiconductor which causes negative shift of the threshold voltage.

In other words, when oxygen deficiency is caused in the oxide semiconductor, it is difficult to suppress trapping of a charge at an interface between the base layer and the oxide semiconductor. However, by providing an insulating layer from which oxygen is released by heating for the base layer, the interface state between the oxide semiconductor and the base layer and the oxygen deficiency in the oxide semiconductor can be reduced and the adverse effect of the trapping of a charge at the interface between the oxide semiconductor and the base layer can be made small.

The base layer 102 may be formed using an insulating material containing the same kind of component as the oxide semiconductor to be formed later. In the case where the base layer 102 is a stack of different layers, a layer in contact with the oxide semiconductor is formed using an insulating material containing the same kind of component as the oxide semiconductor. This is because such a material is compatible with the oxide semiconductor, and therefore, the use of such a material for the base layer 102 enables a state of the interface between the oxide semiconductor and the base layer 102 to be kept well. Here, "the same kind of component as the oxide semiconductor" means one or more of elements selected from constituent elements of the oxide semiconductor. For example, in the case where the oxide semiconductor is formed using an In—Ga—Zn-based oxide semiconductor material, gallium oxide is given as an insulating material containing the same kind of component as the oxide semiconductor.

Next, an oxide semiconductor is formed over the base layer 102. Before the oxide semiconductor is formed, in order that hydrogen, a hydroxyl group, and moisture are contained in the oxide semiconductor as little as possible, it is preferable to preheat the substrate 101 in a preheating chamber of a deposition apparatus so that an impurity such as hydrogen or moisture adsorbed on the substrate 101 or the base layer 102 is removed and exhausted. As an exhaustion unit provided in the preheating chamber, a cryopump is preferable. Note that this preheating treatment can be omitted. Further, this preheating treatment may be performed on the substrate 101 in a similar manner before formation of the base layer 102.

The oxide semiconductor preferably contains at least indium (In) or zinc (Zn). It is particularly preferable that In and Zn be contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor layer preferably includes In, more preferably In and Ga.

Note that here, for example, an "In—Ga—Zn-based oxide" means an oxide containing indium (In), gallium (Ga), and zinc (Zn) and there is no particular limitation on the ratio of In:Ga:Zn. Further, a metal element in addition to In, Ga, and Zn may be contained.

For the oxide semiconductor layer, a thin film expressed by the chemical formula, $InMO_3(ZnO)_m$ (m>0), can be used. Note that M represents one or more metal elements selected from Sn, Zn, Ga, Al, Mn, and Co. Alternatively, a material represented by $In_3SnO_5(ZnO)_n$ (n>0) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm. Note that $R_a$ can be measured using an atomic force microscope (AFM).

As the oxide semiconductor having crystallinity, a CAAC-OS (c-axis aligned crystalline oxide semiconductor) is preferable. The CAAC-OS is not completely single crystal nor completely amorphous. The CAAC-OS is an oxide semiconductor with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor film is higher than that in the vicinity of the surface where the oxide semiconductor film is formed in some cases. Further, when an impurity is added to the CAAC-OS, the crystal part in a region to which the impurity is added becomes amorphous in some cases.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

The CAAC-OS becomes a conductor, a semiconductor, or an insulator depending on its composition or the like. The CAAC-OS transmits or does not transmit visible light depending on its composition or the like. Note that nitrogen may be substituted for part of oxygen included in the CAAC-OS.

With use of the CAAC-OS in a transistor, change in electric characteristics of the transistor due to irradiation with visible light or ultraviolet light can be reduced. Thus, the transistor has high reliability.

An example of a crystal structure of the CAAC-OS will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
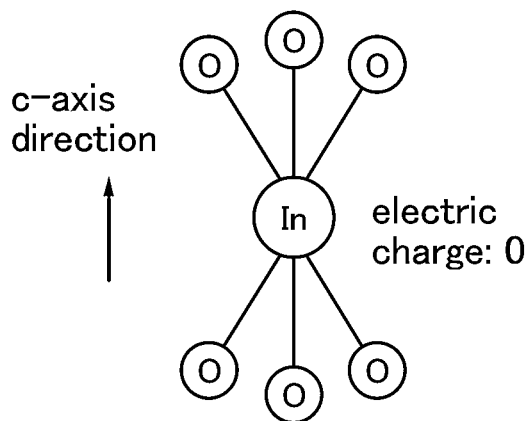
FIGS. 15A to 15E show crystal structures of oxide materials.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
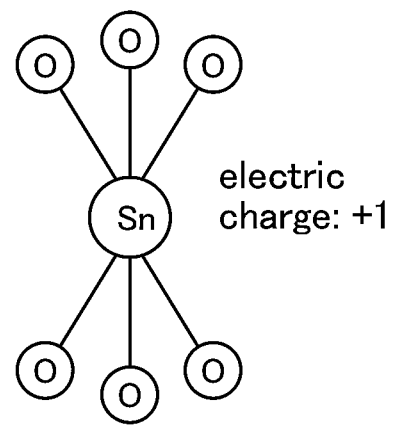
Figure 15B:
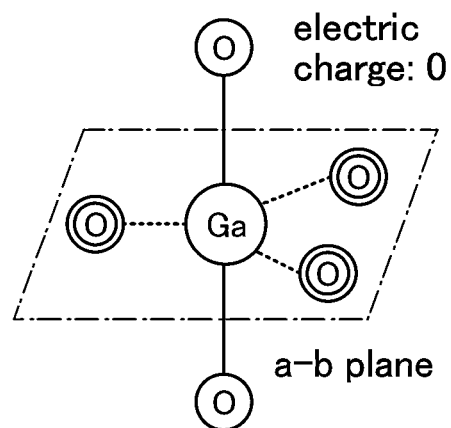

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
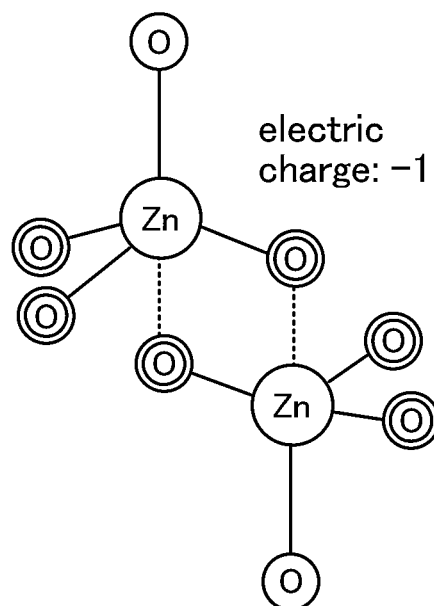
Figure 15C:
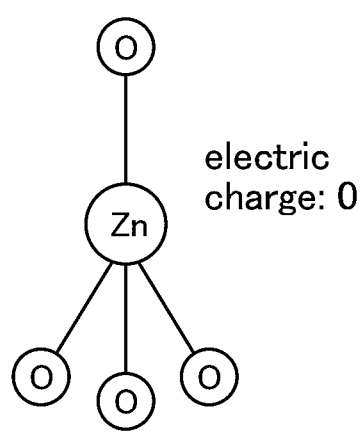

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the stacked structure is 0.

Figure 16A:
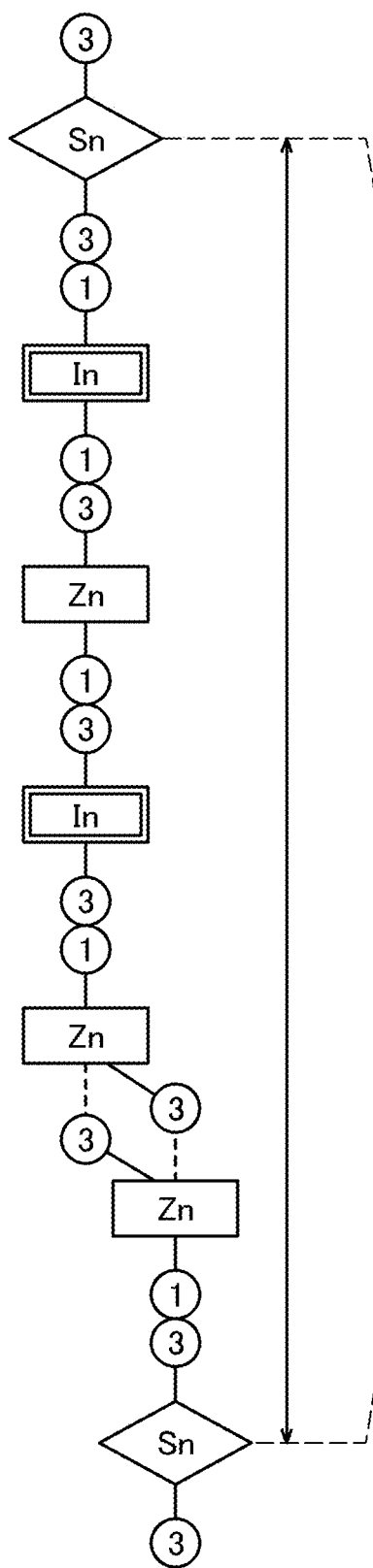
FIGS. 16A to 16C show a crystal structure of an oxide material.
Figure 16B:
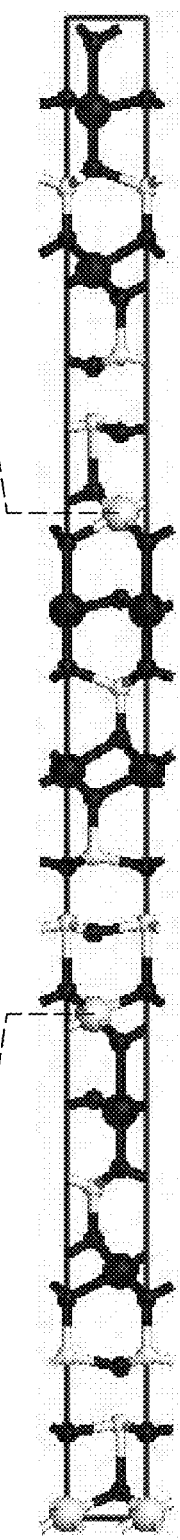
Figure 16C:
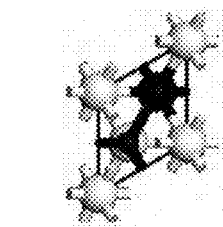

FIG. 16A illustrates a model of a medium group included in a stacked structure of an In—Sn—Zn-based oxide. FIG. 16B illustrates a large group including three medium groups. Note that FIG. 16C illustrates an atomic arrangement in the case where the stacked structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the stacked structure of the In—Sn—Zn-based oxide in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a stacked structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the stacked structure can be 0.

When the large group illustrated in FIG. 16B is repeated, an In—Sn—Zn-based oxide crystal ($In_2SnZn_3O_8$) can be obtained. Note that a stacked structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 17A:
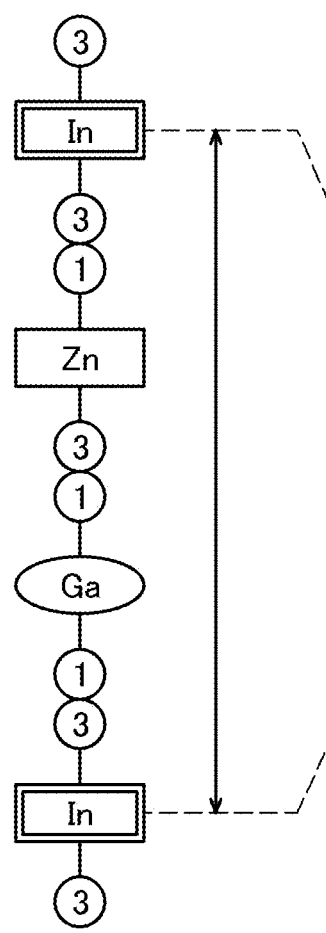
FIGS. 17A to 17C show a crystal structure of an oxide material.

As an example, FIG. 17A illustrates a model of a medium group included in a stacked structure of an In—Ga—Zn-based oxide.

In the medium group included in the stacked structure of the In—Ga—Zn-based oxide in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 17B:
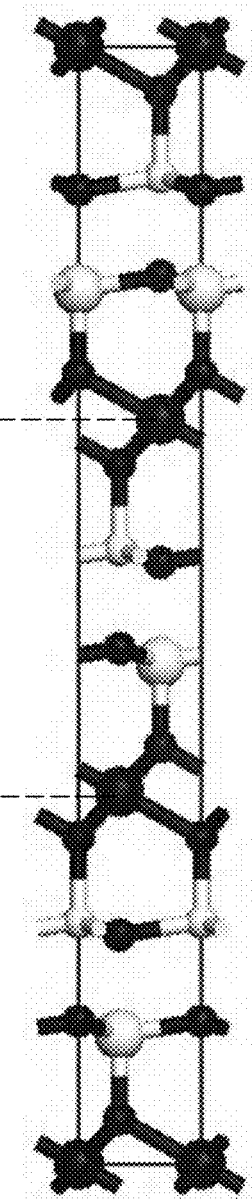
Figure 17C:
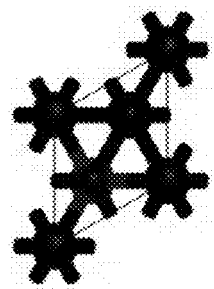

FIG. 17B illustrates a large group including three medium groups. Note that FIG. 17C illustrates an atomic arrangement in the case where the stacked structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the stacked structure of the In—Ga—Zn-based oxide, a large group can be formed using not only the medium group illustrated in FIG. 17A but also a medium group in which the arrangement of the In atom, the Ga atom, and the Zn atom is different from that in FIG. 17A.

When the large group illustrated in FIG. 17B is repeated, a crystal of an In—Ga—Zn-based oxide can be obtained. Note that a stacked structure of the obtained In—Ga—Zn-based oxide can be expressed as a composition formula, $InGaO_3(ZnO)_n$ (n is a natural number).

Figure 18A:
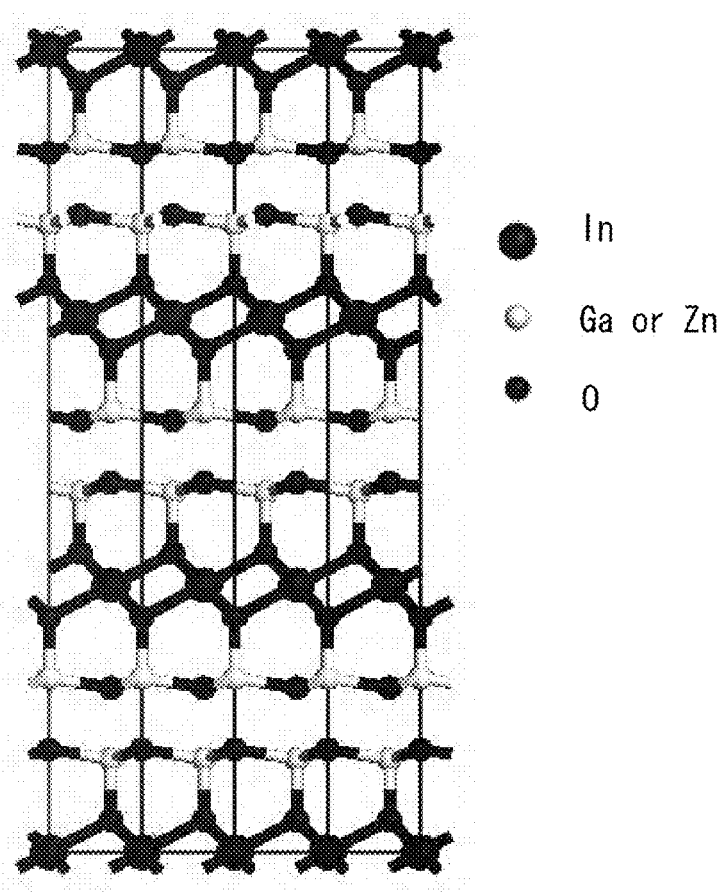
FIGS. 18A and 18B show crystal structures of oxide materials.

In the case where n=1 ($InGaZnO_4$), a crystal structure illustrated in FIG. 18A can be obtained, for example. Note that in the crystal structure in FIG. 18A, since a Ga atom and an In atom each have five ligands as illustrated in FIG. 15B, a structure in which Ga is replaced with In can be obtained.

Figure 18B:
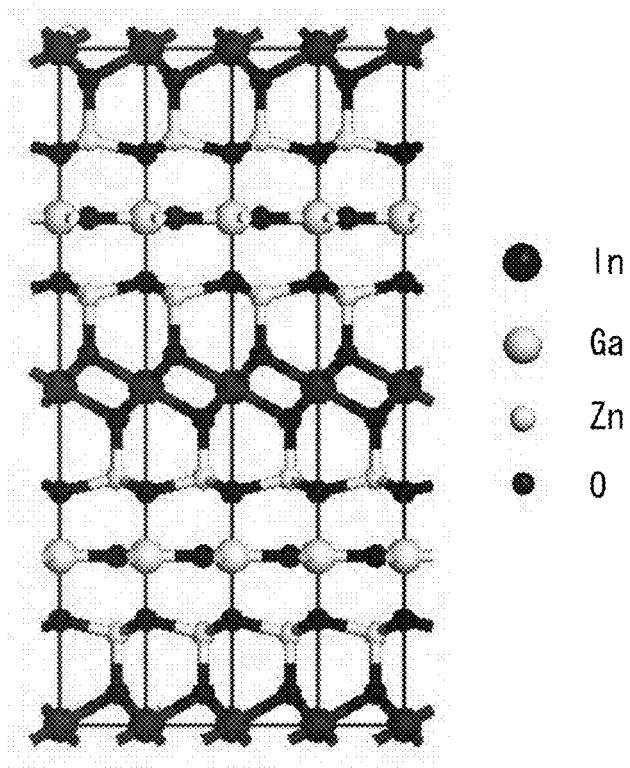

In the case where n=2 ($InGaZn_2O_5$), a crystal structure illustrated in FIG. 18B can be obtained, for example. Note that in the crystal structure in FIG. 18B, since a Ga atom and an In atom each have five ligands as described in FIG. 15B, a structure in which Ga is replaced with In can be obtained.

In this embodiment, first, a first oxide semiconductor having a thickness of greater than or equal to 1 nm and less than or equal to 10 nm is formed over the base layer 102 by a sputtering method. The substrate temperature is set to higher than or equal to 200° C. and lower than or equal to 400° C. in formation of the first oxide semiconductor.

A sputtering apparatus used for formation of the oxide semiconductor will be described in detail below.

The leakage rate of a deposition chamber used for forming an oxide semiconductor is preferably lower than or equal to $1 \times 10^{-10}$ Pa·m³/second. Thus, entry of an impurity into a film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m³/second.

In order to decrease external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the deposition chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the deposition apparatus may be covered with iron fluoride, aluminum oxide, chromium oxide, or the like which is in the passive state.

Furthermore, it is preferable to provide a gas refiner for a sputtering gas just in front of the deposition chamber. At this time, the length of a pipe between the gas refiner and the deposition chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the deposition chamber is preferably performed with a rough vacuum pump, such as a dry pump, and a high vacuum pump, such as a sputter ion pump, a turbo molecular pump, or a cryopump, in appropriate combination. In order to remove moisture remaining in the deposition chamber, an entrapment vacuum pump such as a cryopump, an ion pump, or a titanium sublimation pump is preferably used. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective. The evacuation unit may be a turbo molecular pump provided with a cold trap. In the deposition chamber which is evacuated with an entrapment vacuum pump such as a cryopump, a hydrogen atom, a compound containing a hydrogen atom such as water ($H_2O$) (more preferably, also a compound containing a carbon atom), and the like are removed, whereby the impurity concentration in the oxide semiconductor layer formed in the deposition chamber can be reduced.

An adsorbate present at the inner wall of the deposition chamber does not affect the pressure in the deposition chamber because it is adsorbed on the inner wall, but the adsorbate leads to release of gas at the time of the evacuation of the deposition chamber. Therefore, although the leakage rate and the evacuation rate do not have a correlation, it is important that the adsorbate present in the deposition chamber be desorbed as much as possible and evacuation be performed in advance with the use of a pump having high evacuation capability. Note that the deposition chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as a power supply device for generating plasma as appropriate.

As an In—Ga—Zn-based oxide target for forming an In—Ga—Zn-based oxide material as an oxide semiconductor by a sputtering method, for example, a target having a composition ratio of $In_2O_3:Ga_2O_3:ZnO=1:1:1$ [molar ratio] can be used. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used. Further, an In—Ga—Zn-based oxide target having an atomic ratio of In:Ga:Zn=1:1:1, 4:2:3, 3:1:2, 1:1:2, 2:1:3, or 3:1:4 can be used. When an oxide semiconductor is formed using an In—Ga—Zn-based oxide target having any of the aforementioned atomic ratios, a polycrystal or CAAC-OS is easily formed.

An In—Sn—Zn-based oxide can be referred to as ITZO. In the case of forming an oxide semiconductor using an In—Sn—Zn-based oxide by a sputtering method, it is preferable to use an In—Sn—Zn-based oxide target having an atomic ratio of In:Sn:Zn=1:1:1, 2:1:3, 1:2:2, or 20:45:35. When an oxide semiconductor is formed using a target of an In—Sn—Zn-based oxide having the above atomic ratio, a polycrystal or a CAAC-OS is likely to be formed.

The relative density of the metal oxide target used for forming an oxide semiconductor is higher than or equal to 90% and lower than or equal to 100%, preferably higher than or equal to 95% and lower than or equal to 99.9%. With the use of a metal oxide target with a high relative density, a dense oxide semiconductor layer can be deposited.

As a sputtering gas, a rare gas (typically argon) atmosphere, an oxygen atmosphere, or a mixed gas of a rare gas and oxygen is used as appropriate. It is preferable that a high-purity gas from which impurities such as hydrogen, water, a hydroxyl group, and hydride are removed be used as a sputtering gas. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

The substrate temperature in deposition is set to higher than or equal to 150° C. and lower than or equal to 450° C., preferably higher than or equal to 200° C. and lower than or equal to 350° C. The deposition is performed while the substrate is heated to higher than or equal to 150° C. and lower than or equal to 450° C., preferably higher than or equal to 200° C. and lower than or equal to 350° C., whereby moisture (including hydrogen) or the like is prevented from entering a film.

By heating the substrate during deposition, the concentration of an impurity such as hydrogen, moisture, hydride, or a hydroxide in the formed oxide semiconductor can be reduced. In addition, damage by sputtering can be reduced. Then, a sputtering gas from which hydrogen and moisture are removed is introduced into the deposition chamber while moisture remaining therein is removed, and the first oxide semiconductor having a thickness of greater than or equal to 1 nm and less than or equal to 10 nm, preferably greater than or equal to 2 nm and less than or equal to 5 nm is formed with the use of the above target.

In this embodiment, the first oxide semiconductor is formed to a thickness of 5 nm in an oxygen atmosphere, an argon atmosphere, or an atmosphere including argon and oxygen under conditions where as a target for an oxide semiconductor, a target for an In—Ga—Zn-based oxide semiconductor ($In_2O_3:Ga_2O_3:ZnO=1:1:2$ [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. The first oxide semiconductor is crystallized by the first heat treatment to be a first crystalline oxide semiconductor.

Depending on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the base layer 102 is diffused to an interface between the base layer and the first crystalline oxide semiconductor layer or the vicinity of the interface (within ±5 nm from the interface), whereby oxygen deficiency in the first crystalline oxide semiconductor is reduced. Therefore, it is preferable that oxygen be included in (in a bulk of) the base layer 102 or at the interface between the first crystalline oxide semiconductor and the base layer 102 at an amount that exceeds at least the stoichiometric proportion.

Then, a second oxide semiconductor with a thickness greater than 10 nm is formed over the first crystalline oxide semiconductor. The second oxide semiconductor is formed by a sputtering method, and the substrate temperature in the deposition is set to be higher than or equal to 200° C. and lower than or equal to 400° C. By setting the substrate temperature in the deposition to be higher than or equal to 200° C. and lower than or equal to 400° C., precursors can be arranged in the oxide semiconductor formed on and in contact with the surface of the first crystalline oxide semiconductor and so-called orderliness can be obtained.

In this embodiment, the second oxide semiconductor is formed to a thickness of 25 nm in an oxygen atmosphere, an argon atmosphere, or an atmosphere including argon and oxygen under conditions where as a target for an oxide semiconductor, a target for an In—Ga—Zn-based oxide semiconductor ($In_2O_3:Ga_2O_3:ZnO=1:1:2$ [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. A second crystalline oxide semiconductor is formed by the second heat treatment. The second heat treatment is performed in a nitrogen atmosphere, an oxygen atmosphere, or a mixed atmosphere of nitrogen and oxygen, whereby the density of the second crystalline oxide semiconductor is increased and the number of defects therein is reduced. By the second heat treatment, crystal growth proceeds in the thickness direction with the use of the first crystalline oxide semiconductor as a nucleus, that is, crystal growth proceeds from the bottom to the inside; thus, the second crystalline oxide semiconductor is formed. At this time, to compose the first crystalline oxide semiconductor and the second crystalline oxide semiconductor using the same kind of element is referred to as "homo-growth". Alternatively, to compose the first crystalline oxide semiconductor and the second crystalline oxide semiconductor using elements, at least one kind of which differs between the first crystalline oxide semiconductor and the second crystalline oxide semiconductor, is referred to as "hetero-growth".

Thus, in a formation step of an oxide semiconductor, entry of an impurity is prevented as much as possible by pressure of a deposition chamber, leakage rate of the deposition chamber, or the like, so that an impurity such as hydrogen or moisture is prevented from entering the oxide semiconductor. Hydrogen contained in the oxide semiconductor is reacted with oxygen bonded to a metal atom to be water, and in addition, a defect is formed in a lattice from which the oxygen is detached (or a portion from which the oxygen is removed).

Thus, the impurity is reduced as much as possible in the formation process of the oxide semiconductor, whereby defects in the oxide semiconductor can be reduced. From the above, a transistor in which a channel region is formed in the oxide semiconductor including purified CAAC-OS obtained by removing an impurity as much as possible has a small amount of change in threshold voltage between before and after light irradiation or the BT test against the transistor and thus has stable electric characteristics.

Further, after the second heat treatment, it is preferable to perform additional heat treatment in which atmosphere is changed to an oxidizing atmosphere while the temperature is kept. The oxygen defects in the oxide semiconductor can be reduced by the heat treatment in an oxidizing atmosphere.

Note that a metal oxide which can be used for the oxide semiconductor has band gap of 2 eV or more, preferably 2.5 eV or more, further preferably 3 eV or more. In this manner, off-state current of a transistor can be reduced by using a metal oxide having a wide band gap.

It is preferable to perform the steps from the formation of the base layer 102 to the second heat treatment successively without exposure to the air. The steps from the formation of the base layer 102 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 3A:
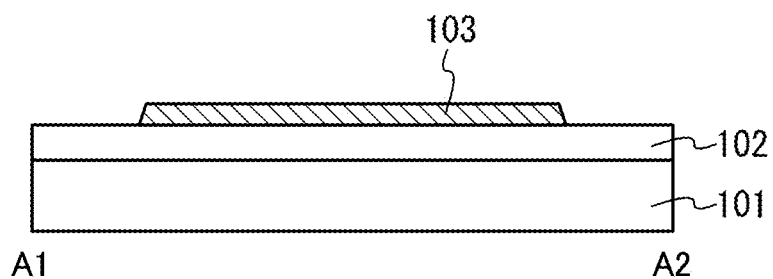
FIGS. 3A to 3D are cross-sectional views illustrating an embodiment of the present invention.
Figure 3B:
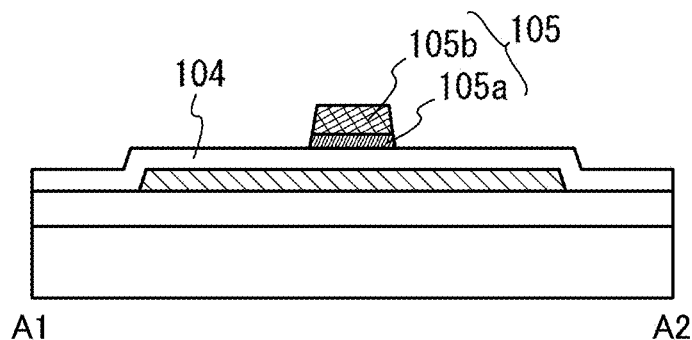
Figure 3C:
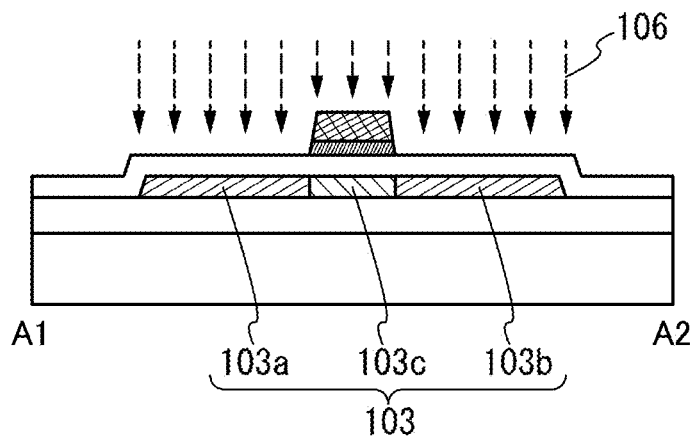
Figure 3D:
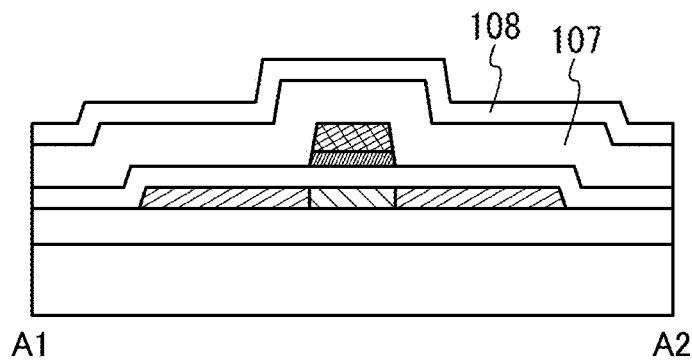

Next, the stack of oxide semiconductor layers including the first crystalline oxide semiconductor and the second crystalline oxide semiconductor is processed to form an island-shaped oxide semiconductor layer 103 (see FIG. 3A).

The oxide semiconductor can be processed by being etched after a mask having a desired shape is formed over the oxide semiconductor. The mask can be formed by a method such as photolithography. Alternatively, the mask may be formed by a method such as an inkjet method or a printing method.

For the etching of the oxide semiconductor, either a dry etching method or a wet etching method may be employed. It is needless to say that both of them may be employed in combination.

One of features of the first and second crystalline oxide semiconductors obtained by the above formation method is that they have c-axis alignment. Note that the first crystalline oxide semiconductor and the second crystalline oxide semiconductor have neither a single crystal structure nor an amorphous structure and are crystalline oxide semiconductors having c-axis alignment (CAAC-OS).

Without limitation to the two-layer structure in which the second crystalline oxide semiconductor is formed over the first crystalline oxide semiconductor, a stacked structure including three or more layers may be formed by repeatedly performing a process of deposition and heat treatment for forming a third crystalline oxide semiconductor after the second crystalline oxide semiconductor is formed.

By forming a transistor with the use of a stack of a first crystalline oxide semiconductor and a second crystalline oxide semiconductor, like the oxide semiconductor layer 103, the transistor can have stable electric characteristics and high reliability.

Next, the gate insulating layer 104 is formed over the oxide semiconductor layer 103. The gate insulating layer 104 can be formed using a single layer or a stacked layer using one or more of materials selected from aluminum nitride, aluminum oxide, aluminum nitride oxide, aluminum oxynitride, silicon nitride, silicon oxide, silicon nitride oxide, silicon oxynitride, tantalum oxide, and lanthanum oxide.

When a high-k material such as hafnium silicate (HfSiO$_x$ (x>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, or yttrium oxide is used as the gate insulating layer 104, while the substantial (e.g., silicon oxide equivalent) thickness of the gate insulating film is not changed, the physical thickness of the gate insulating film can be increased so that gate leakage current can be reduced. Further, a stacked structure can be used in which a high-k material and one or more of silicon oxide, silicon oxynitride, silicon nitride, silicon nitride oxide, aluminum oxide, aluminum oxynitride, and gallium oxide are stacked. For example, the thickness of the gate insulating layer 104 is preferably greater than or equal to 1 nm and less than or equal to 300 nm, and more preferably greater than or equal to 5 nm and less than or equal to 50 nm. When the thickness of the gate insulating film 104 is greater than or equal to 5 nm, gate leakage current can be reduced.

The gate insulating layer 104 is formed by a sputtering method, a CVD method, or the like. Other than a sputtering method and a plasma CVD method, the gate insulating layer 104 can be formed by a deposition method such as a high-density plasma CVD method using microwaves (e.g., a frequency of 2.45 GHz). The gate insulating layer 104 is not limited to a single layer, and a stack of different layers may be used. Note that the gate insulating layer 104 is preferably an insulating layer containing oxygen, more preferably an oxide insulating layer from which oxygen is released by heating, in a portion which is in contact with the oxide semiconductor layer 103. Silicon oxide is used for the gate insulating layer 104, whereby oxygen is diffused to the oxide semiconductor layer 103 and oxygen deficiencies in the oxide semiconductor layer 103 are reduced; thus, favorable transistor characteristics can be obtained.

In the structure described in this embodiment, only the oxide semiconductor layer 103 causes a depression and a projection over a substrate and the gate insulating layer 104 hardly has a portion which overlaps with a step; therefore, leakage current due to the gate insulating layer 104 can be reduced and withstand voltage of the gate insulating layer 104 can be increased. Accordingly, a transistor can be operated even when the gate insulating layer 104 is as thin as approximately 5 nm. Note that a reduction in thickness of the gate insulating layer 104 has effects of reducing a short channel effect and increasing the operation speed of the transistor.

Before the gate insulating layer 104 is formed, the surface of the oxide semiconductor layer 103 may be exposed to plasma of an oxidizing gas such as oxygen, ozone, or dinitrogen monoxide so as to be oxidized, thereby reducing the oxygen deficiency. In this embodiment, as the gate insulating layer 104, oxide silicon is formed to a thickness of 100 nm over the oxide semiconductor layer 103.

Next, a conductive layer is formed over the gate insulating layer 104 by a sputtering method, a vacuum evaporation method, or a plating method, a mask is formed over the conductive layer, and the conductive layer is selectively etched to form the gate electrode 105. The mask formed over the conductive layer can be formed by a printing method, an inkjet method, or a photolithography method as appropriate. The gate electrode 105 includes the gate electrode 105a which is in contact with the gate insulating layer 104 and the gate electrode 105b which is stacked over the gate electrode 105a.

As a material of the gate electrode 105a, indium gallium zinc oxide (In—Ga—Zn—O) containing nitrogen, indium tin oxide (In—Sn—O) containing nitrogen, indium gallium oxide (In—Ga—O) containing nitrogen, indium zinc oxide (In—Zn—O) containing nitrogen, tin oxide (Sn—O) containing nitrogen, indium oxide (In—O) containing nitrogen, or a metal nitride (e.g., InN, ZnN) is preferably used.

These material each have a work function of 5 eV or higher, preferably 5.5 eV or higher. The gate electrode 105a is provided between the gate electrode 105b and the gate insulating layer 104 and overlaps with the oxide semiconductor layer 103 with the gate insulating layer 104 interposed therebetween, whereby the threshold voltage of the electric characteristics of the transistor can be positive. Accordingly, a so-called normally-off switching element can be obtained. For example, in the case where In—Ga—Zn—O containing nitrogen is used for the gate electrode 105a, In—Ga—Zn—O having a nitrogen concentration higher than at least that of the oxide semiconductor layer 103, specifically, In—Ga—Zn—O having a nitrogen concentration of higher than or equal to 7 at. % is used.

As a material used for forming the gate electrode 105b, a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like can be used. Further, one or more metal elements selected from manganese (Mn), magnesium (Mg), zirconium (Zr), and beryllium (Be) may be used.

Further, the gate electrode 105b may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, a three-layer structure in which titanium, aluminum, and titanium are stacked in this order, and the like can be given.

The gate electrode 105b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked structure formed using the above light-transmitting conductive material and the above metal element.

In this embodiment, for the gate electrode 105a, indium gallium zinc oxide containing nitrogen is used. Further, for the gate electrode 105b, two-layer structure in which tungsten is stacked over titanium nitrogen is used (see FIG. 3B). Note that end portions of the formed gate electrode 105 preferably have a tapered shape, so that the coverage with a layer formed later is improved.

Next, the source region 103a and the drain region 103b are formed by a self-aligned process. Specifically, with the use of the gate electrode 105 as a mask, a dopant 106 is added to the oxide semiconductor layer 103 by an ion doping method or an ion implantation method. As the dopant 106, one or more elements selected from Group 15 (Group 5B) elements such as nitrogen (N) or phosphorus (P) can be used.

Further, the dopant 106 is not added to the region in the oxide semiconductor layer 103, which overlaps with the gate electrode 105, due to the gate electrode 105 serving as a mask. The region serves as the channel formation region 103c.

The source region 103a and the drain region 103b to which the dopant 106 is added each become an n-type oxide semiconductor, which have lower resistivity than the channel formation region 103c. Therefore, the resistance of the source region 103a and the drain region 103b is low, whereby the transistor 100 can be operated at high speed. In addition, with the use of a self-aligned process, the source region 103a and the drain region 103b hardly overlap with the gate electrode 105, leading to reduction in parasitic capacitance; thus, the transistor 100 can be operated at higher speed.

Alternatively, with the use of the gate electrode 105 as a mask, the source region 103a and the drain region 103b may be formed in such a manner that regions of the gate insulating layer 104 over the regions to be the source region and the drain region in the oxide semiconductor layer 103 are removed so that the regions in the oxide semiconductor layer 103 are exposed, and the dopant 106 is added to the exposed regions of the oxide semiconductor layer 103. The regions of the gate insulating layer 104 over the oxide semiconductor layer 103 are removed under such a condition that the oxide semiconductor layer 103 is hardly etched.

The dopant 106 can be added to the exposed regions of the oxide semiconductor layer 103 by a method other than an ion doping method and an ion implantation method. For example, the dopant 106 can be added to the exposed regions of the oxide semiconductor layer 103 in such a manner that plasma is generated in a gas atmosphere including an element to be added and the exposed regions of the oxide semiconductor layer 103 are subjected to plasma treatment. At this time, a bias is preferably applied to the substrate 101. The greater a bias applied to the substrate is, the deeper the dopant 106 can be added to the oxide semiconductor layer 103. As an apparatus for generating plasma, a dry etching apparatus, a plasma CVD apparatus, a high-density plasma CVD apparatus, or the like can be used.

However, an oxide semiconductor layer might be etched to be thinned when a dopant is added by plasma treatment. Therefore, the dopant 106 is preferably added to the exposed regions of oxide semiconductor layer 103 by an ion doping method or an ion implantation method.

Further, when the gate insulating layer 104 over regions of the oxide semiconductor layer 103, which are to be the source region 103a and the drain region 103b, is removed, the regions of the oxide semiconductor layer 103, which are to be the source region 103a and the drain region 103b, might be etched at the same time to be thinned. As a result, resistance of the source region 103a and the drain region 103b is increased, and defective units due to over-etching caused by unnecessary thinning of a layer are produced more frequently.

This phenomenon becomes serious in the case where dry etching is performed under such conditions that the etching selectivity ratio of the gate insulating layer 104 with respect to the oxide semiconductor layer 103 is not sufficiently high. In general, in the case of forming a transistor with a short channel length, a dry etching method with high processing accuracy needs to be employed; otherwise, a source region and a drain region are easily thinned.

The problem would not arise when the oxide semiconductor layer 103 is thick enough. In the case where the channel length is less than or equal to 200 nm, the thickness of the portion of the oxide semiconductor layer to be a channel is required to be less than or equal to 20 nm, preferably less than or equal to 10 nm, in order to prevent a short channel effect. In the case where such a thin oxide semiconductor layer is used, it is not favorable that the thickness of the oxide semiconductor layer is reduced as described above.

Therefore, the dopant 106 is preferably added to the oxide semiconductor layer 103 by an ion doping method or an ion implantation method while the gate insulating layer 104 remains so as not to expose the oxide semiconductor layer 103. The dopant 106 is added to the oxide semiconductor layer 103 through the gate insulating layer 104, so that excessive damage to the oxide semiconductor layer 103 can be reduced. Furthermore, the interface between the oxide semiconductor layer 103 and the gate insulating layer 104 is kept clean, so that characteristics and reliability of the transistor are improved. Moreover, the depth to which the dopant 106 is added (addition region) is easily controlled, so that the dopant 106 can be accurately added to the oxide semiconductor layer 103.

In this embodiment, nitrogen (N) is used as the dopant 106, which is added to the oxide semiconductor layer 103 by an ion implantation method through the gate insulating layer 104. The concentrations of nitrogen in the source region 103a and the drain region 103b which are formed by adding nitrogen is controlled to be higher than or equal to $5 \times 10^{19}$ atoms/cm$^3$ and lower than or equal to $1 \times 10^{22}$ atoms/cm$^3$, preferably higher than or equal to $1 \times 10^{20}$ atoms/cm$^3$ and lower than 7 at. % (see FIG. 3 C).

Next, heat treatment is performed at a temperature higher than or equal to 300° C. and lower than or equal to 600° C. in a reduced pressure atmosphere, an inert gas atmosphere such as a nitrogen atmosphere or a rare gas atmosphere, an oxygen gas atmosphere, or an ultra-dry air (with a moisture content of 20 ppm (equivalent to a dew point of −55° C.) or lower, preferably 1 ppm or lower, further preferably 10 ppb or lower when measured with a dew-point meter using cavity ring-down laser spectroscopy (CRDS)). In this embodiment, heat treatment is performed at 450° C. in a nitrogen atmosphere for one hour with the use of an electric furnace which is a kind of heat treatment apparatuses.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed in the following manner: the substrate is moved into an inert gas heated to a high temperature and is heated for several minutes, and then the substrate is moved out of the inert gas.

When the heat treatment is performed in an atmosphere of an inert gas such as nitrogen or a rare gas or ultra-dry air, it is preferable that the atmosphere do not contain water, hydrogen, and the like. It is also preferable that nitrogen, oxygen, or a rare gas which is introduced into the heat treatment apparatus have a purity of 6N (99.9999%) or more, preferably 7N (99.99999%) or more (that is, the impurity concentration is 1 ppm or less, preferably 0.1 ppm or less).

Through the above heat treatment, the source region 103a and the drain region 103b can have a wurtzite crystal structure. Further, the low-concentration region 103d and the low-concentration region 103e can also have a wurtzite crystal structure. The heat treatment can be performed at any time after the dopant 106 is added.

The dopant 106 is added by an ion doping method, an ion implantation method, or the like while the substrate is heated, whereby a wurtzite crystal structure can be obtained without additional heat treatment.

Next, the insulating layer 107 and the insulating layer 108 are formed by a sputtering method, a CVD method, or the like to cover the oxide semiconductor layer 103 and the gate electrode 105. The insulating layer 107 and the insulating layer 108 can each be formed using a material selected from aluminum nitride, aluminum oxide, aluminum nitride oxide, aluminum oxynitride, silicon nitride, silicon oxide, silicon nitride oxide, and silicon oxynitride.

The thickness of each of the insulating layer 107 and the insulating layer 108 is greater than or equal to 50 nm, preferably greater than or equal to 200 nm and less than or equal to 500 nm. In this embodiment, silicon oxide is formed to a thickness of 300 nm as the insulating layer 107 and aluminum oxide is formed to a thickness of 100 nm as the insulating layer 108.

The insulating layer 108 is preferably formed using silicon nitride or aluminum oxide in order to prevent entry of an impurity or the like from the outside. In this embodiment, aluminum oxide is formed to a thickness of 100 nm as the insulating layer 108 (see FIG. 3D). One of or both of the insulating layer 107 and the insulating layer 108 may be omitted.

After the insulating layer 108 is formed, if necessary, heat treatment may be performed in an atmosphere which hardly contains hydrogen and moisture (a nitrogen atmosphere, an oxygen atmosphere, a dry-air atmosphere (for example, as for moisture, a dew point is lower than or equal to −40° C., preferably lower than or equal to −60° C.), or the like) at a temperature higher than or equal to 150° C. and lower than or equal to 650° C., preferably higher than or equal to 200° C. and lower than or equal to 500° C.

Figure 4A:
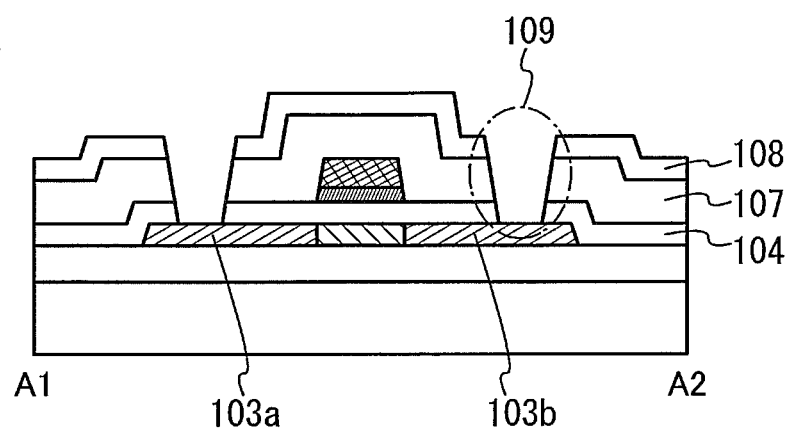
FIGS. 4A and 4B are cross-sectional views illustrating an embodiment of the present invention.

Next, a mask is formed over the insulating layer 108, part of the gate insulating layer 104, part of the insulating layer 107, and part of the insulating layer 108 are selectively etched with the use of the mask to expose part of the source region 103a and part of the drain region 103b; thus, the contact holes 109 are formed (see FIG. 4A).

Figure 4B:
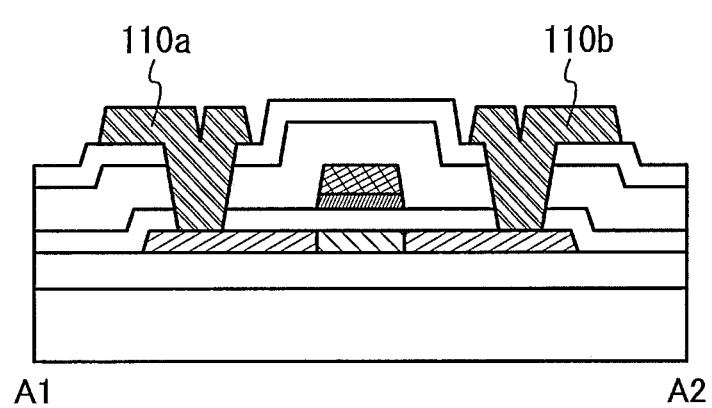

Next, a conductive layer is formed over the insulating layer 108, a mask is formed over the conductive layer, and the conductive layer is selectively etched to form the source electrode 110a and the drain electrode 110b (see FIG. 4B). A material similar to that of the gate electrode 105b can be used for the conductive layer used for forming the source electrode 110a and the drain electrode 110b.

In this embodiment, as the conductive layer used for forming the source electrode 110a and the drain electrode 110b, a conductive layer in which Cu is stacked over a Cu—Mg—Al alloy is used. The Cu—Mg—Al alloy material is provided in contact with the insulating layer 108, whereby adhesion of the conductive layer can be improved.

Note that the channel length of the transistor 100 is equal to the length of the channel formation region 103c which is sandwiched between the source region 103a and the drain region 103b in FIG. 1B. Further, the channel length of the transistor 100 is substantially equal to the width of the gate electrode 105.

Through the above steps, even when a transistor is miniaturized and the channel length is reduced, the transistor 100 with high reliability which includes an oxide semiconductor and has favorable electric characteristics can be manufactured.

The transistor 140 includes the low-concentration region 103d and the low-concentration region 103e in the oxide semiconductor layer 103. The transistor 140 can be manufactured in such a manner that a step of forming the sidewalls 111 is added to the steps of manufacturing the transistor 100 and the dopant 106 is added to the oxide semiconductor layer 103 in two steps.

The low-concentration region 103d and the low-concentration region 103e can be formed by a self-aligned process using the gate electrode 105 as a mask. Specifically, after formation of the gate electrode 105, the dopant 106 is added to the oxide semiconductor layer 103 with the use of the gate electrode 105 as a mask by a method similar to that for forming the transistor 100 (also referred to as a first doping step). As the dopant 106 which is added to the oxide semiconductor layer 103 in the first doping step, an element similar to the dopant 106 which is used for forming the transistor 100 can be used. In the first doping step, the dopant 106 is added so that the concentration of the dopant 106 in the oxide semiconductor layer 103 is higher than or equal to $5 \times 10^{18}$ atoms/cm$^3$ and lower than $5 \times 10^{19}$ atoms/cm$^3$.

Next, the sidewalls 111 are formed on the side surfaces of the gate electrode 105. The sidewalls 111 can be formed by a known method.

Next, the dopant 106 is added to the oxide semiconductor layer 103 with the use of the gate electrode 105 and the sidewalls 111 as masks (also referred to as a second doping step). As the dopant 106 which is added to the oxide semiconductor layer 103 in the second doping step, an element similar to the dopant 106 which is used for forming the transistor 100 can be used. In the second doping step, the dopant 106 is added so that the concentration of the dopant 106 in the oxide semiconductor layer 103 is higher than or equal to $5 \times 10^{19}$ atoms/cm$^3$ and lower than or equal to $1 \times 10^{22}$ atoms/cm$^3$, preferably higher than or equal to $1 \times 10^{20}$ atoms/cm$^3$ and lower than 7 at. %.

Thus, the source region 103a, the drain region 103b, the low-concentration region 103d, and the low-concentration region 103e can be formed in the transistor 140. The low-concentration region 103d and the low-concentration region 103e have lower dopant concentration and higher resistivity than the source region 103a and the drain region 103b.

The low-concentration region 103d and the low-concentration region 103e are provided, whereby degradation of the transistor characteristics and negative shift in threshold voltage due to a short channel effect can be reduced; thus, a highly reliable transistor can be manufactured.

Note that the channel length of the transistor 140 is equal to the length of the channel formation region 103c which is sandwiched between the low-concentration region 103d and the low-concentration region 103e in FIG. 2B. Further, the channel length of the transistor 140 is substantially equal to the width of the gate electrode 105.

This embodiment can be combined as appropriate with any of the other embodiments.

(Embodiment 2)

In this embodiment, examples of transistors having structures different from those of the transistors disclosed in Embodiment 1 will be described.

Figure 5A:
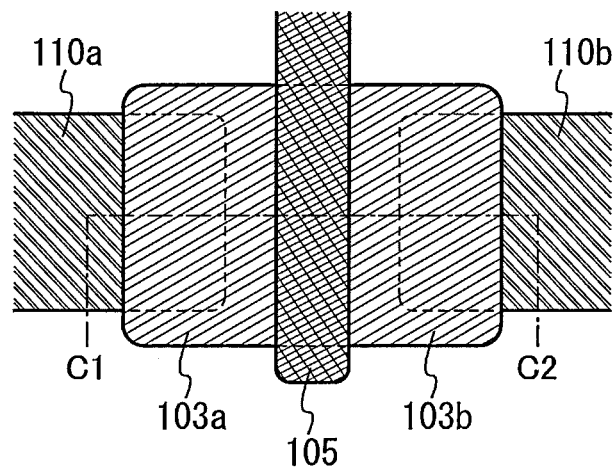
FIGS. 5A and 5B are a top view and a cross-sectional view illustrating an embodiment of the present invention.
Figure 5B:
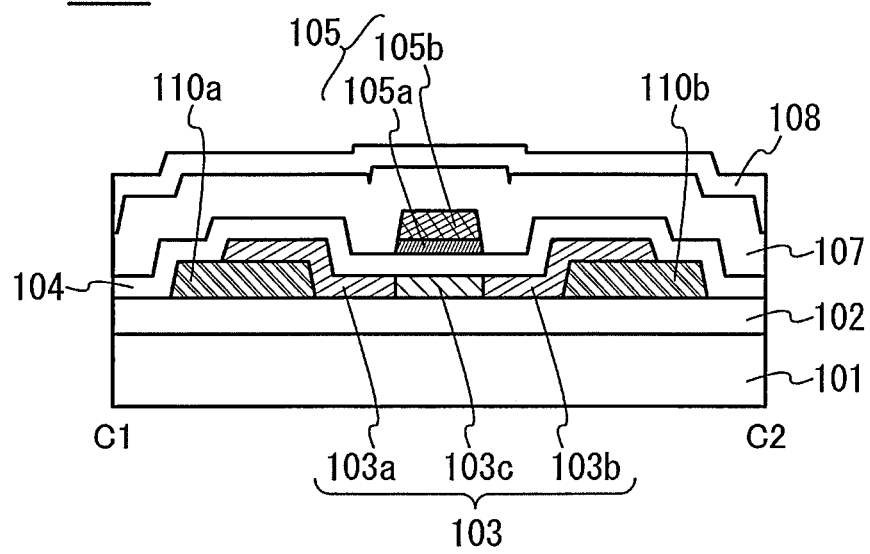

FIG. 5A is a top view illustrating a structure of a transistor 150 and FIG. 5B is a cross-sectional view illustrating a stacked structure of a portion indicated by a chain line C1-C2 in FIG. 5A. In FIG. 5A, a substrate and an insulating layer are omitted.

In the transistor 150 illustrated in FIG. 5B, the source electrode 110a and the drain electrode 110b are stacked in a different manner from the stacking manner of the transistor 100 disclosed in Embodiment 1. In the transistor 150, the source electrode 110a and the drain electrode 110b are formed over the base layer 102, and the oxide semiconductor layer 103 is formed over the base layer 102, the source electrode 110a, and the drain electrode 110b.

In the transistor 150, the source electrode 110a and the drain electrode 110b are connected to the source region 103a and the drain region 103b in the oxide semiconductor layer 103, respectively, without the contact holes 109; therefore, the contact area can be easily increased, and the contact resistance can be easily reduced.

Note that the channel length of the transistor 150 is equal to the length of the channel formation region 103c which is sandwiched between the source region 103a and the drain region 103b in FIG. 5B. Further, the channel length of the transistor 150 is substantially equal to the width of the gate electrode 105.

Figure 6A:
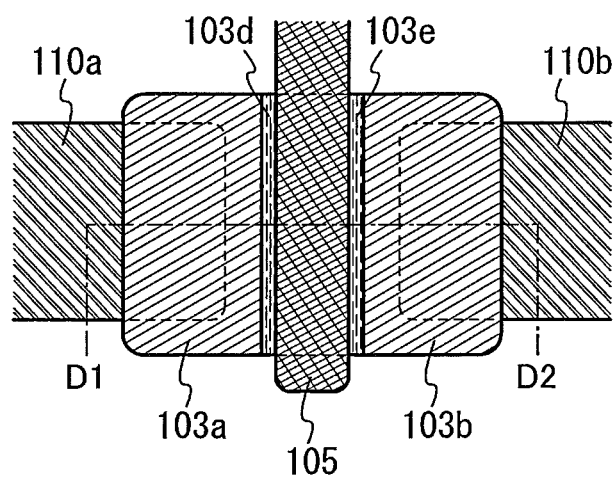
FIGS. 6A and 6B are a top view and a cross-sectional view illustrating an embodiment of the present invention.
Figure 6B:
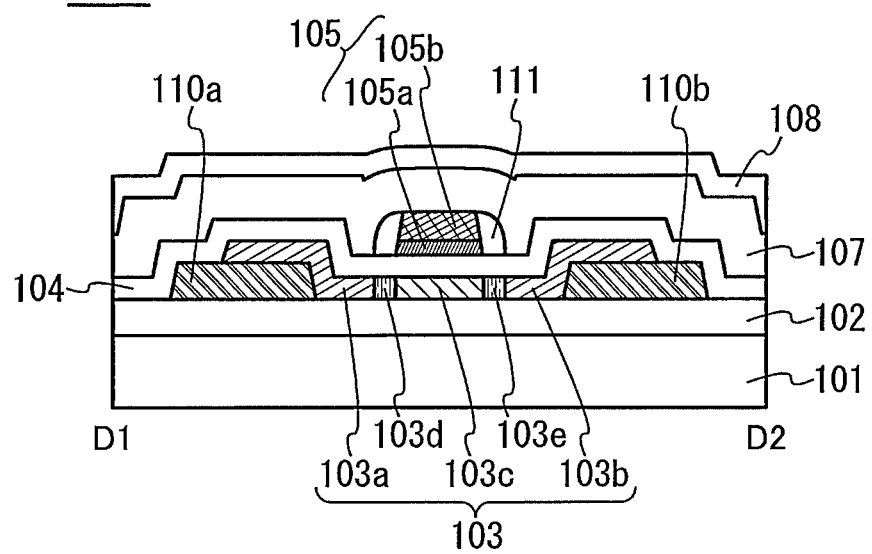

A transistor 160 illustrated in FIGS. 6A and 6B includes, in addition to the structure of the transistor 150, the sidewalls 111 on the side surfaces of the gate electrode 105 and the low-concentration region 103d and the low-concentration region 103e in regions of the oxide semiconductor layer 103, which overlap with the sidewalls 111. The low-concentration region 103d is formed between the channel formation region 103c and the source region 103a, and the low-concentration region 103e is formed between the channel formation region 103c and the drain region 103b. FIG. 6A is a top view illustrating the structure of the transistor 160 and FIG. 6B is a cross-sectional view illustrating a stacked structure of a portion indicated by a chain line D1-D2 in FIG. 6A.

The low-concentration region 103d or the low-concentration region 103e is provided in the oxide semiconductor layer 103, whereby an electric field generated between the channel formation region 103c and the source region 103a or between the channel formation region 103c and the drain region 103b can be relieved; thus, degradation of transistor characteristics can be reduced. In particular, relieving an electric field generated between the channel formation region 103c and the drain region 103b is effective for reduction of degradation of transistor characteristics. Further, the low-concentration region 103d or the low-concentration region 103e is provided, so that a short channel effect due to miniaturization of a transistor can be suppressed.

Note that the channel length of the transistor 160 is equal to the length of the channel formation region 103c which is sandwiched between the low-concentration region 103d and the low-concentration region 103e in FIG. 6B. Further, the channel length of the transistor 160 is substantially equal to the width of the gate electrode 105.

Figure 7A:
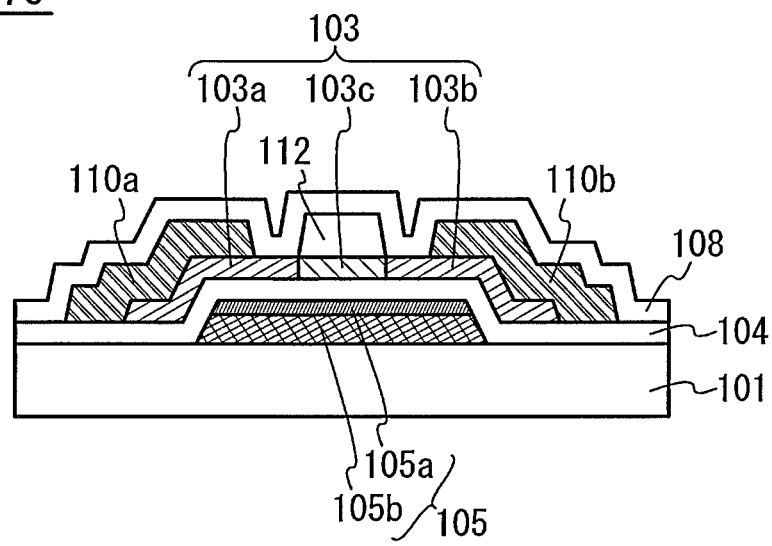
FIGS. 7A and 7B are cross-sectional views each illustrating an embodiment of the present invention.

A transistor 170 illustrated in FIG. 7A is one mode of a bottom-gate transistor.

FIG. 7A illustrates a cross-sectional structure of the transistor 170. In the transistor 170, the gate electrode 105 is formed over the substrate 101 and the gate insulating layer 104 is formed over the gate electrode 105. The gate electrode 105 has a structure in which the gate electrode 105a is stacked over the gate electrode 105b. The base layer described in Embodiment 1 may be provided between the substrate 101 and the gate electrode 105.

Further, the oxide semiconductor layer 103 is formed over the gate insulating layer 104 and a channel protective layer 112, the source electrode 110a, and the drain electrode 110b are formed over the oxide semiconductor layer 103. The oxide semiconductor layer 103 includes the channel formation region 103c which overlaps with the channel protective layer 112, the source region 103a which is electrically connected to the source electrode 110a, and the drain region 103b which is electrically connected to the drain electrode 110b.

The channel protective layer 112 can be formed using a material and a method similar to those of the gate insulating layer 104. The thickness of the channel protective layer 112 is greater than or equal to 10 nm and less than or equal to 500 nm, preferably greater than or equal to 100 nm and less than or equal to 300 nm.

The source region 103a and the drain region 103b of the transistor 170 can be formed using the channel protective layer 112 as a mask in a manner similar to the source region 103a and the drain region 103b of the transistor 100.

Further, the insulating layer 108 is formed over the channel protective layer 112, the source electrode 110a, and the drain electrode 110b. The insulating layer 108 may be a stack of a plurality of insulating layers.

Note that the channel length of the transistor 170 is equal to the length of the channel formation region 103c which is sandwiched between the source region 103a and the drain region 103b in FIG. 7A. Further, the channel length of the transistor 170 is substantially equal to the width of the channel protective layer 112.

Figure 7B:
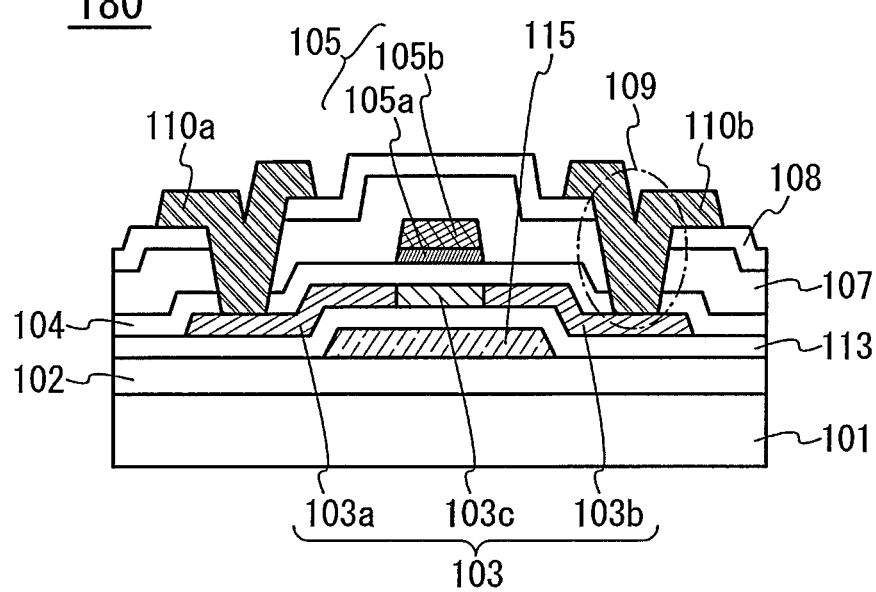

FIG. 7B illustrates a cross-sectional structure of a transistor 180. The transistor 180 has a structure in which a back gate electrode 115 and an insulating layer 113 are provided to the transistor 100. In the transistor 180, the back gate electrode 115 is formed over the base layer 102 and the insulating layer 113 is formed over the back gate electrode 115. The oxide semiconductor layer 103 of the transistor 180 overlaps with the back gate electrode 115 with the insulating layer 113 interposed therebetween.

The back gate electrode 115 is positioned so that the channel formation region 103c of the oxide semiconductor layer 103 is interposed between the gate electrode 105 and the back gate electrode 115. The back gate electrode 115 is formed using a conductive layer and can function in a manner similar to that of the gate electrode 105. By changing a potential of the back gate electrode 115, the threshold voltage of the transistor can be changed.

The back gate electrode 115 can be formed using a material and a method similar to those of the gate electrode 105b. A layer similar to the gate electrode 105a may be formed between the back gate electrode 115 and the insulating layer 113.

The insulating layer 113 can be formed using a material and a method similar to those of the gate insulating layer 104. Formation of the base layer 102 can be omitted when the insulating layer 113 also serves as the base layer 102.

Note that the channel length of the transistor 180 is equal to the length of the channel formation region 103c which is sandwiched between the source region 103a and the drain region 103b in FIG. 7B. Further, the channel length of the transistor 180 is substantially equal to the width of the gate electrode 105.

This embodiment can be combined as appropriate with any of the other embodiments.

(Embodiment 3)

In this embodiment, a method for forming an oxide semiconductor film including CAAC-OS, which is different from the method disclosed in Embodiment 1, will be described.

First, an oxide semiconductor film having a thickness of greater than or equal to 1 nm and less than or equal to 50 nm is formed over the base layer 102.

The substrate temperature in deposition is set to higher than or equal to 150° C. and lower than or equal to 450° C., preferably higher than or equal to 200° C. and lower than or equal to 350° C. The deposition is performed while the substrate is heated to higher than or equal to 150° C. and lower than or equal to 450° C., preferably higher than or equal to 200° C. and lower than or equal to 350° C., whereby moisture (including hydrogen) or the like is prevented from entering a film. Further, CAAC-OS which is an oxide semiconductor layer having crystallinity can be formed.

Further, it is preferable that hydrogen be further released from the oxide semiconductor and part of oxygen contained in the base layer 102 be diffused into the oxide semiconductor and the vicinity of the interface of the oxide semiconductor in the base layer 102 by performing heat treatment on the substrate 101 after formation of the oxide semiconductor. An oxide semiconductor including more highly crystalline CAAC-OS can be formed by the heat treatment.

The temperature of the heat treatment is preferably a temperature at which hydrogen is released from the oxide semiconductor and part of oxygen contained in the base layer 102 is released and diffused into the oxide semiconductor. The temperature is typically higher than or equal to 200° C. and lower than the strain point of the substrate 101, preferably higher than or equal to 250° C. and lower than or equal to 450° C. By diffusion of oxygen into the oxide semiconductor, oxygen deficiency in the oxide semiconductor can be reduced.

A rapid thermal annealing (RTA) apparatus can be used in the heat treatment. With the use of the RTA apparatus, heat treatment can be performed at a temperature of higher than or equal to the strain point of a substrate if the heating time is short. Therefore, time for forming an oxide semiconductor in which the proportion of a crystalline region is higher than that of an amorphous region can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from three minutes to 24 hours. The proportion of a crystalline region to an amorphous region in the oxide semiconductor can be increased as the treatment time is increased. However, heat treatment for longer than 24 hours is not preferable because the productivity is reduced.

Through the above steps, an oxide semiconductor including CAAC-OS can be formed.

This embodiment can be combined as appropriate with any of the other embodiments.

(Embodiment 4)

In this embodiment, an influence on the electric characteristics of the transistor including an oxide semiconductor described in Embodiment 1 or 2 will be described with reference to band diagrams.

Figure 8:
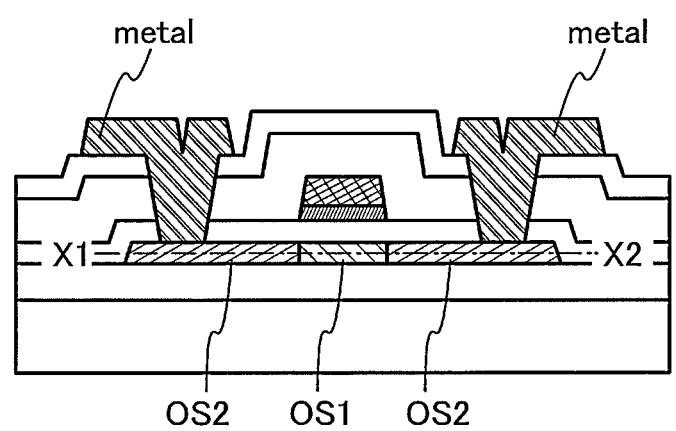
FIG. 8 is a cross-sectional view illustrating an embodiment of the present invention.
Figure 9A:
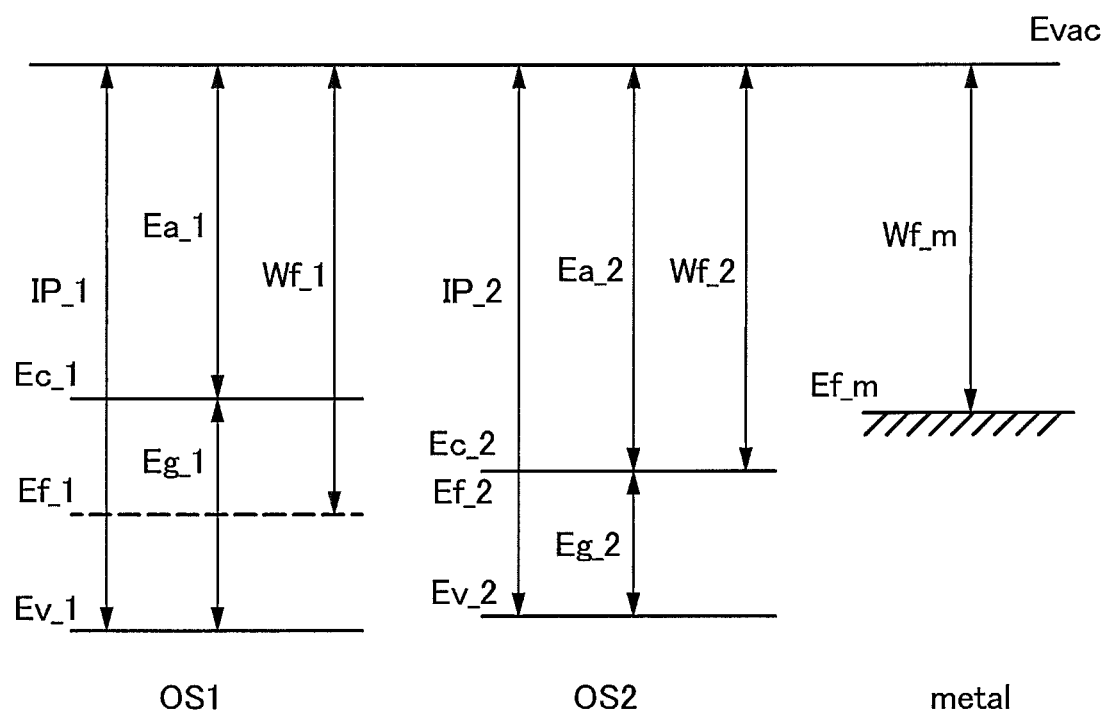
FIGS. 9A and 9B illustrate band structures of an oxide semiconductor and a metal material.
Figure 9B:
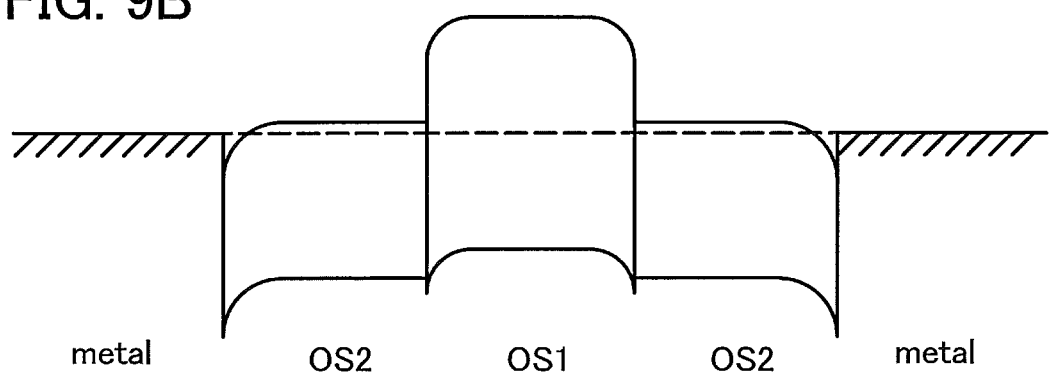

FIG. 8 is a cross-sectional view of a transistor having a stacked structure similar to the transistor 100 illustrated in FIGS. 1A and 1B. FIGS. 9A and 9B are energy band diagrams (schematic diagrams) of cross section X1-X2 in FIG. 8. FIG. 9B shows the case where a voltage of a source and a voltage of a drain are equal to each other (VD=0V). FIG. 8 illustrates the transistor provided with an oxide semiconductor layer including a first oxide semiconductor region (OS1) and a pair of second oxide semiconductor regions (OS2) and source and drain electrodes (metal).

In FIG. 8, a channel formation region of the transistor is formed using OS1. OS1 is an oxide semiconductor which is made to be intrinsic (i-type) or as close to intrinsic as possible by highly purifying the film through removal or elimination of impurities such as moisture (including hydrogen) as much as possible and further by reducing oxygen deficiency in the film. Thus, the Fermi level (Ef) can be the same as the intrinsic Fermi level (Ei).

In addition, in FIG. 8, a source region and a drain region of the transistor are formed using the pair of OS2. OS2 is formed in such a manner that an oxide semiconductor is made to be intrinsic (i-type) or as close to intrinsic as possible as in the case of OS1 by highly purifying the film through removal or elimination of impurities such as moisture (including hydrogen) as much as possible and further by reducing oxygen deficiency in the film, and after that, at least one element selected from Group 15 elements such as nitrogen, phosphorus, or arsenic is added. OS2 has thus higher carrier density than OS1 and the position of its Fermi level is close to the conduction band.

FIG. 9A shows a relation of band structures of the vacuum level (Evac), the first oxide semiconductor region (OS1), the second oxide semiconductor region (OS2), and the source and drain electrodes (metal). Here, IP represents the ionization potential; Ea, the electron affinity; Eg, the energy gap; and Wf, the work function. In addition, Ec represents the bottom of the conduction band; Ev, the top of the valence band; and Ef, the Fermi level. As for a sign at the end of each symbol, 1 denotes OS1; 2, OS2; and m, metal. Here, a metal material having Wf_m of 4.1 eV (such as titanium) is assumed as the metal.

OS1 is an oxide semiconductor which is made to be i-type or as close to i-type as possible and thus has extremely low carrier density; therefore, Ef_1 is around the middle point between Ec and Ev. OS2 is an n-type oxide semiconductor having high carrier density, and thus Ec_2 substantially corresponds to Ef_2.

It is said that the energy gap (Eg) of the oxide semiconductor denoted by OS1 is 3.15 eV and the electron affinity (Ea) thereof is 4.3 eV. The energy gap (Eg) of the oxide semiconductor denoted by OS2 can be smaller than 3.15 in accordance with the amount of a dopant to be added. In that case, ionization potential hardly changes, so that an electron affinity and work function become large. FIGS. 9A and 9B illustrate the case where Eg of OS2 is smaller than Eg of OS1 (i.e., Eg_1>Eg_2).

As shown in FIG. 9B, in the case where OS1 that is the channel formation region and OS2 that is the source or drain region are in contact with each other, transfer of carriers occurs so that the Fermi levels can be equal to each other;

thus, the band edge of OS1 curves. Further, in the case where OS2 is in contact with the metal that is the source or drain electrode, transfer of carriers occurs so that the Fermi levels can be equal to each other; thus, the band edge of OS2 curves.

By forming OS2 that is an n-type oxide semiconductor between OS1 that is the channel formation region and the metal that is the source or drain electrode, contact between the oxide semiconductor and the metal can be an ohmic junction, and contact resistance can be reduced. As a result, the on-state current of the transistor can be increased. Moreover, the curve at the band edge of OS1 can be suppressed, and thus a short-channel effect of the transistor can be suppressed.

This embodiment can be combined as appropriate with any of the other embodiments.

(Embodiment 5)

Figure 10A:
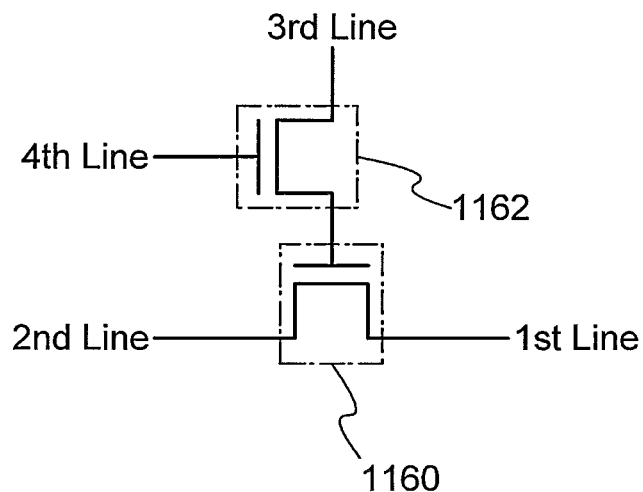
FIGS. 10A and 10B are circuit diagrams each illustrating an embodiment of the present invention.

An example of a circuit diagram of a memory element (hereinafter also referred to as a memory cell) included in a semiconductor device is illustrated in FIG. 10A. The memory cell includes a transistor 1160 in which a channel formation region is formed using a material other than an oxide semiconductor and a transistor 1162 in which a channel formation region is formed using an oxide semiconductor.

The transistor 1162 in which the channel formation region is formed using an oxide semiconductor can be manufactured in accordance with Embodiment 1.

As illustrated in FIG. 10A, a gate electrode of the transistor 1160 is electrically connected to one of a source electrode and a drain electrode of the transistor 1162. A first wiring (a 1st line, also referred to as a source line) is electrically connected to a source electrode of the transistor 1160. A second wiring (a 2nd line, also referred to as a bit line) is electrically connected to a drain electrode of the transistor 1160. A third wiring (a 3rd line, also referred to as a first signal line) is electrically connected to the other of the source electrode and the drain electrode of the transistor 1162. A fourth wiring (a 4th line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data are described. First, a potential of the fourth wiring is set to a potential at which the transistor 1162 is turned on, so that the transistor 1162 is turned on. Thus, a potential of the third wiring is supplied to the gate electrode of the transistor 1160 (writing). After that, the potential of the fourth wiring is set to a potential at which the transistor 1162 is turned off, so that the transistor 1162 is turned off, and thus, the potential of the gate electrode of the transistor 1160 is held (holding).

Since the off-state current of the transistor 1162 is smaller than the off-state current of the transistor 1160, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Then, reading of data is described. When a predetermined potential (a low potential) is supplied to the first wiring in a state where the on state or the off state of the transistor 1160 is held as described above, a potential of the second wiring varies depending on the on state or the off state of the transistor 1160. For example, when the transistor 1160 is in the on state, the potential of the second wiring becomes lower than the potential of the first wiring. On the other hand, when the transistor 1160 is in the off state, the potential of the second wiring does not vary.

In such a manner, the potential of the second wiring and a predetermined potential are compared with each other in a state where data is held, whereby the data can be read out.

Then, rewriting of data is described. Rewriting of data is performed in a manner similar to that of the writing and holding of data. That is, a potential of the fourth wiring is set to a potential at which the transistor 1162 is turned on, so that the transistor 1162 is turned on. Thus, a potential of the third wiring (a potential for new data) is supplied to the gate electrode of the transistor 1160. After that, the potential of the fourth wiring is set to be a potential at which the transistor 1162 is turned off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that a reduction in operation speed because of erasing operation can be suppressed. In other words, high-speed operation of the semiconductor device including the memory cell can be realized.

Figure 10B:
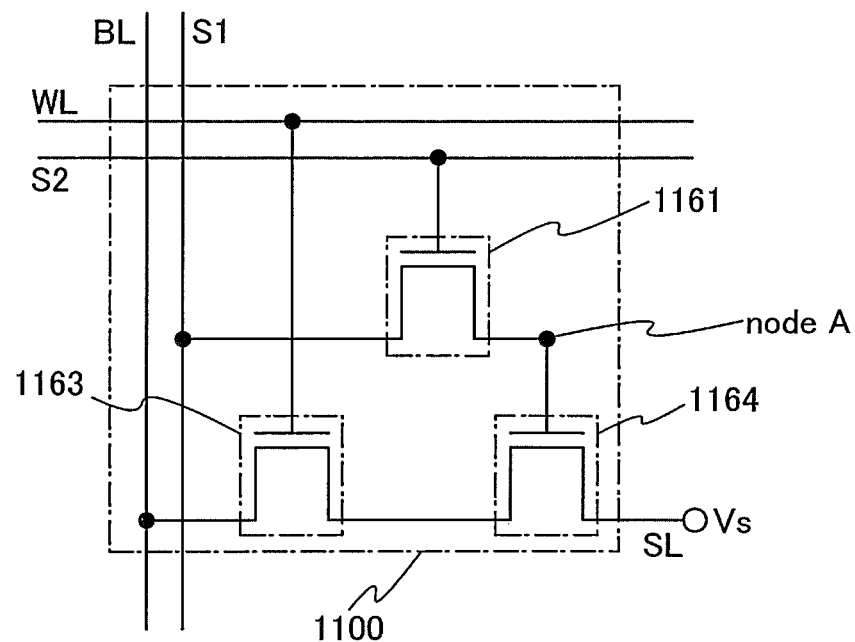

FIG. 10B is a circuit diagram illustrating an application example of the memory cell illustrated in FIG. 10A.

A memory cell 1100 illustrated in FIG. 10B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, operation of the circuit is specifically described.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that at the end of the writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of the data "1" and set to approximately 0 V after the writing of the data "0". Electric charge corresponding to a potential of the third wiring S1 is accumulated at the node A; since the off-state current of the transistor 1161 is smaller than that of a transistor in which a channel formation region is formed using single crystal silicon, the potential of the gate electrode of the transistor 1164 is held for a long time.

When data is read from the memory cell, the first wiring SL is set to 0 V, the fifth wiring WL is set to 2 V, the fourth wiring S2 and the third wiring S1 are set to 0 V, and a reading circuit connected to the second wiring BL is set in an operation state. At this time, the transistor 1163 is in an on state and the transistor 1161 is in an off state.

The transistor 1164 is in an off state when the data "0" has been written, that is, the node A is set to approximately 0 V, so that the resistance between the second wiring BL and the first wiring SL is high. On the other hand, the transistor 1164 is in an on state when the data "1" has been written, that is, the node A is set to approximately 2 V, so that the resistance between the second wiring BL and the first wiring SL is low. A reading circuit can read the data "0" or the data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. In particular, a power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 10A or 10B and can be changed as appropriate.

Figure 11:
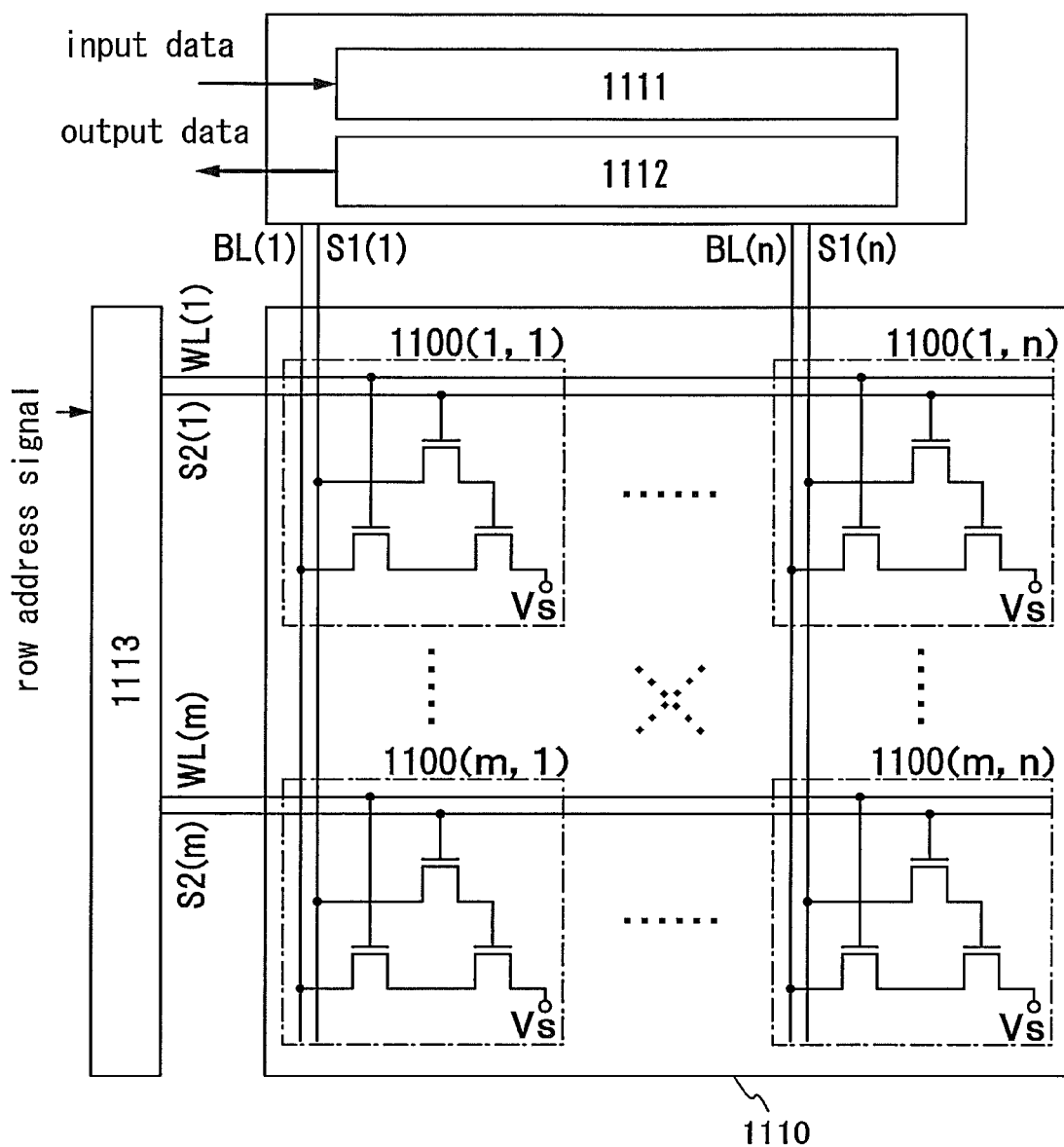
FIG. 11 is a circuit diagram illustrating an embodiment of the present invention.

FIG. 11 is a block circuit diagram of a semiconductor device according to an embodiment of the present invention. The semiconductor device includes m×n bits of memory capacitance.

The semiconductor device illustrated in FIG. 11 includes m fourth wirings, m fifth wirings, n second wirings, n third wirings, a memory cell array 1110 in which a plurality of memory cells 1100(1,1) to 1100(m,n) is arranged in a matrix of m rows by n columns (m and n are each a natural number), and peripheral circuits such as a wiring driver circuit 1111 for driving the second wirings and the third wirings, a wiring driver circuit 1113 for driving the fourth wirings and the fifth wirings, and a reading circuit 1112. A refresh circuit or the like may be provided as another peripheral circuit.

A memory cell 1100(i,j) is considered as a typical example of the memory cell. Here, the memory cell 1100(i,j) is an integer of greater than or equal to 1 and less than or equal to m and j is an integer of greater than or equal to 1 and less than or equal to n) is connected to a second wiring BL(j), a third wiring S1(j), a fourth wiring S2(i), a fifth wiring WL(i), and a first wiring. A first wiring potential Vs is supplied to the first wiring. The second wirings BL(1) to BL(n) and the third wirings S1(1) to S1(n) are connected to the wiring driver circuit 1111 for driving the second wirings and the third wirings and the reading circuit 1112. The fifth wirings WL(1) to WL(m) and the fourth wirings S2(1) to S2(m) are connected to the wiring driver circuit 1113 for driving the fourth wirings and the fifth wirings.

The operation of the semiconductor device illustrated in FIG. 11 is described. In this structure, data is written and read per row.

When data is written into memory cells 1100(i,1) to 1100(i,n) of an i-th row, the first wiring potential Vs is set to 0 V, a fifth wiring WL(i) and the second wirings BL(1) to BL(n) are set to 0 V, and a fourth wiring S2(i) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(i) is set to 0 V before the potentials of the third wirings S1(1) to S1(n) are changed, so that the transistors 1161 are turned off. Moreover, a non-selected fifth wiring WL and a non-selected fourth wiring S2 are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100(i,1) to 1100(i,n) of the i-th row, the first wiring potential Vs is set to 0 V, the fifth wiring WL(i) is set to 2 V, the fourth wiring S2(i) and the third wirings S1(1) to S1(n) are set to 0 V, and the reading circuit connected to the second wirings BL(1) to BL(n) is set in an operation state. The reading circuit can read data "0" or data "1" in accordance with the difference in resistance state of the memory cell, for example. Note that the non-selected fifth wiring WL and the non-selected fourth wiring S2 are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

This embodiment can be combined as appropriate with any of the other embodiments.

(Embodiment 6)

Figure 12A:
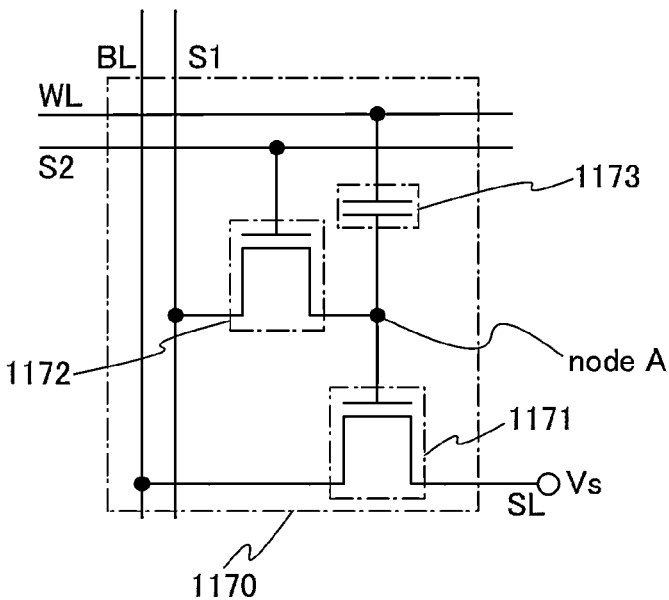
FIGS. 12A and 12B are circuit diagrams each illustrating an embodiment of the present invention.

In this embodiment, an example of a circuit diagram of a memory cell including a capacitor will be shown. A memory cell 1170 illustrated in FIG. 12A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is supplied with 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and is set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is operated. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of reading is set to 0 V; however, the third wiring S1 may be in a floating state or may be charged to have a potential higher than 0 V. Data "1" and data "0" are defined for convenience and may be reversed.

The potential of the third wiring S1 at the time of writing may be selected from the potentials of data "0" and data "1" as long as the transistor 1172 is turned off after the writing and the transistor 1171 is off in the case where the potential of the fifth wiring WL is set to 0 V. The potential of the fifth wiring WL at the time of reading may be selected so that the transistor 1171 is turned off in the case where data "0" has been written and is turned on in the case where data "1" has been written. Furthermore, the threshold voltage of the transistor 1171 is an example. The transistor 1171 can have any threshold voltage as long as the transistor 1171 operates in the above-described manner.

An example of a NOR semiconductor memory device in which a memory cell including a capacitor and a selection transistor having a first gate electrode and a second gate electrode is used will be described with reference to FIG. 12B.

Figure 12B:
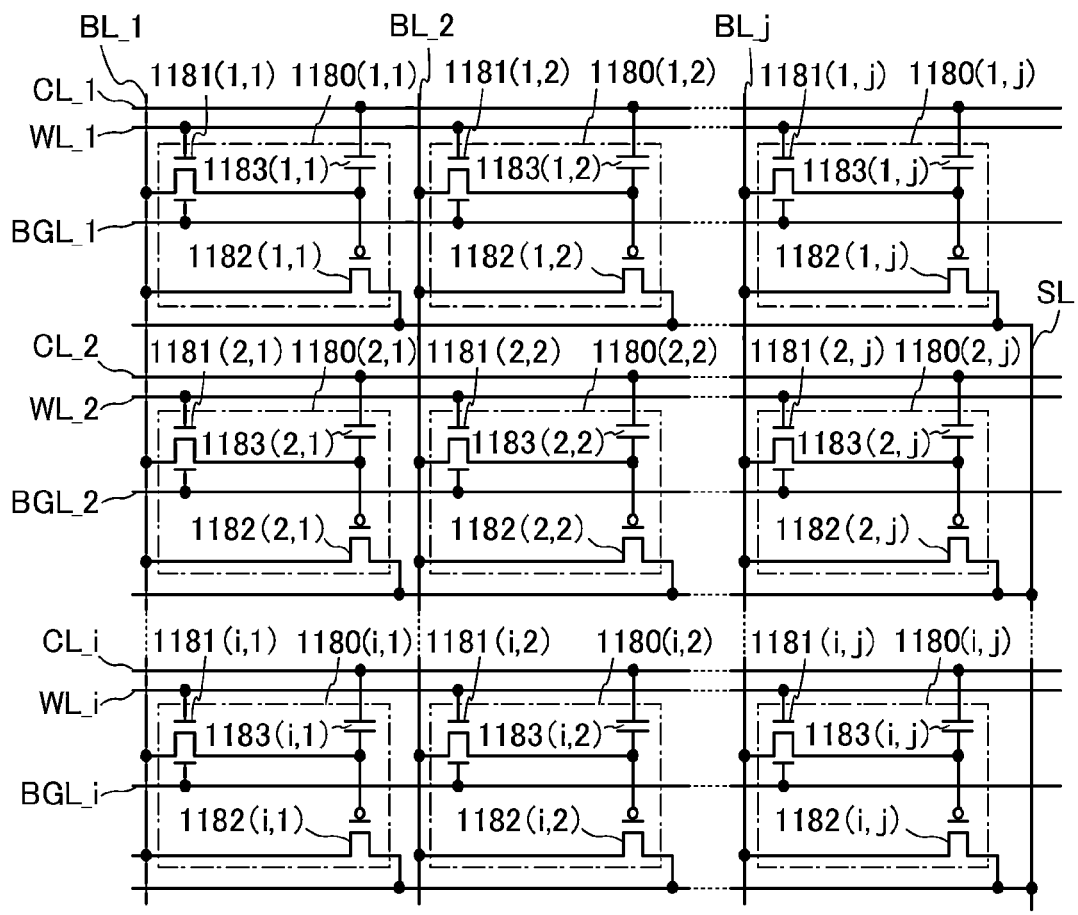

A semiconductor device illustrated in FIG. 12B according to an embodiment of the present invention includes a memory cell array including a plurality of memory cells arranged in a matrix of I rows (I is a natural number of 2 or more) and J columns (J is a natural number).

The memory cell array illustrated in FIG. 12B includes a plurality of memory cells 1180 arranged in a matrix of i rows (i is a natural number of 3 or more) and j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that M is a natural number greater than or equal to 1 and less than or equal to i and that N is a natural number greater than or equal to 1 and less than or equal to j)) includes a transistor 1181(M,N), a capacitor 1183(M,N), and a transistor 1182(M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to the bit line BL_N. The first gate electrode of the transistor 1181(M,N) is connected to the word line WL_M. The second gate electrode of the transistor 1181(M,N) is connected to the gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to the capacitor line CL_M. A second capacitor electrode of the capacitor 1183(M,N) is connected to the other of the source electrode and the drain electrode of the transistor 1181 (M,N). Note that the capacitor 1183(M,N) serves as a storage capacitor.

The voltage of the word lines WL_1 to WL_i is controlled by, for example, a driver circuit including a decoder.

The voltage of the bit lines BL_1 to BL_j is controlled by, for example, a driver circuit including a decoder.

The voltage of the capacitor lines CL_1 to CL_i is controlled by, for example, a driver circuit including a decoder.

The voltage of the gate lines BGL_1 to BGL_i is controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be extremely small. Thus, a data retention period in the memory circuit can be longer. In addition, voltage necessary for writing and reading data can be made lower than that of a conventional semiconductor device; thus, power consumption can be reduced.

This embodiment can be combined as appropriate with any of the other embodiments.

(Embodiment 7)

In this embodiment, examples of a semiconductor device using the transistor described in any of the above embodiments will be described with reference to FIGS. 13A and 13B.

Figure 13A:
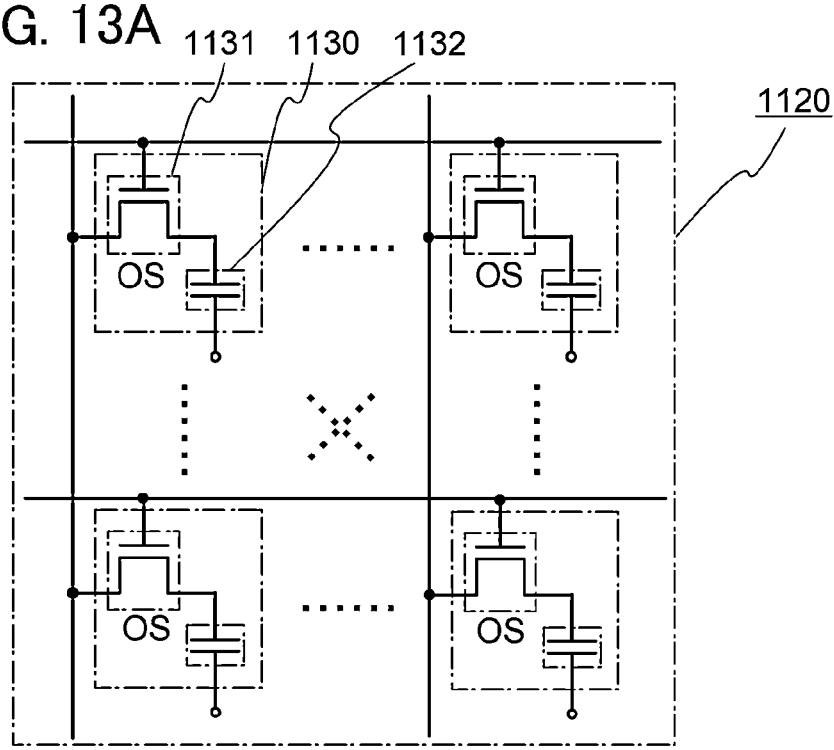
FIGS. 13A and 13B are circuit diagrams each illustrating an embodiment of the present invention.

FIG. 13A illustrates an example of a semiconductor device whose structure corresponds to that of a so-called dynamic random access memory (DRAM). A memory cell array 1120 illustrated in FIG. 13A has a structure in which a plurality of memory cells 1130 is arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor in which a channel formation region is formed using an oxide semiconductor, which is described in any of the above embodiments, is characterized by having smaller off-state current than a transistor in which a channel formation region is formed using single crystal silicon. Accordingly, when the transistor is applied to the semiconductor device illustrated in FIG. 13A, which is regarded as a so-called DRAM, a substantially nonvolatile memory can be obtained.

Figure 13B:
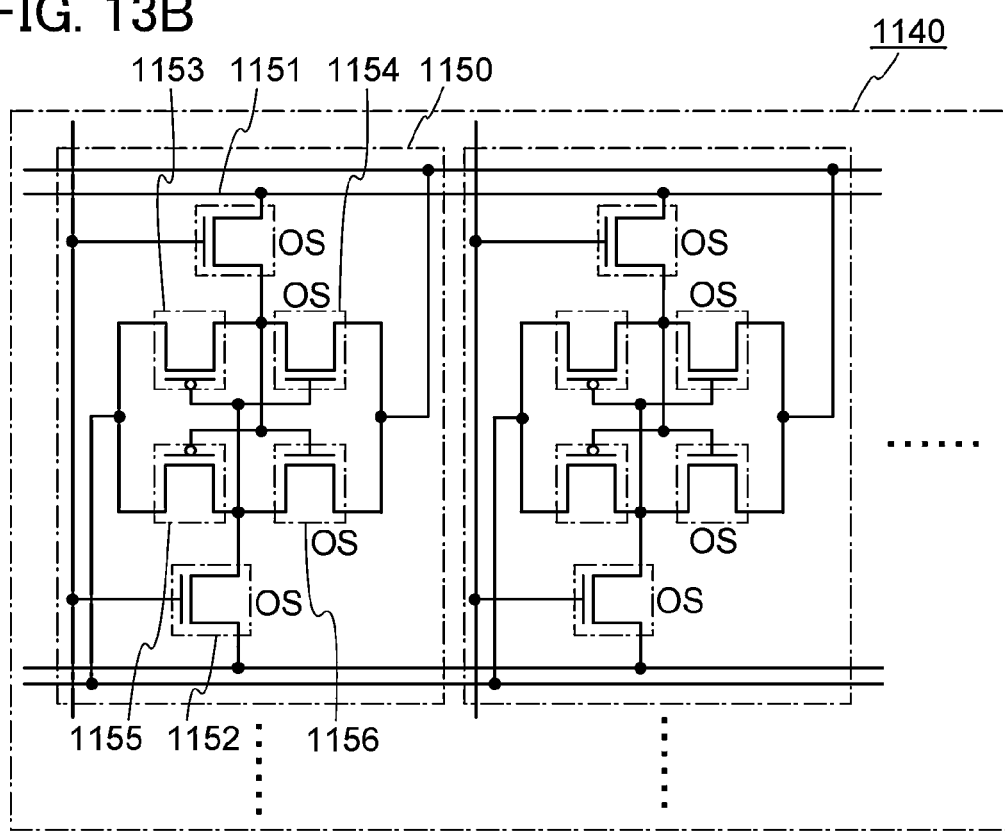

FIG. 13B illustrates an example of a semiconductor device whose structure corresponds to that of a so-called static random access memory (SRAM). A memory cell array 1140 illustrated in FIG. 13B can have a structure in which a plurality of memory cells 1150 is arranged in a matrix. Further, the memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The methods and structures described in this embodiment can be combined as appropriate with any of the structures and the methods described in the other embodiments.

This embodiment can be combined as appropriate with any of the other embodiments.

(Embodiment 8)

A central processing unit (CPU) can be formed using a transistor including an oxide semiconductor in a channel formation region for at least part of the CPU.

Figure 14A:
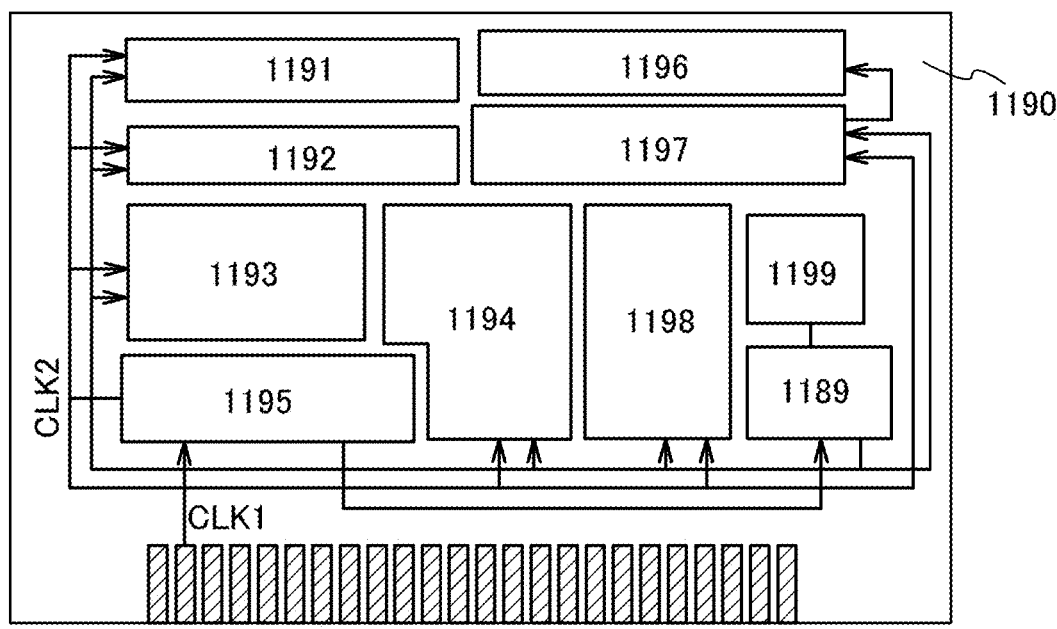
FIG. 14A is a block diagram illustrating a specific example of a CPU and FIGS. 14B and 14C are circuit diagrams each illustrating part of the CPU.

FIG. 14A is a block diagram illustrating a specific structure of a CPU. The CPU illustrated in FIG. 14A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 14A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 14A, a memory element is provided in the register 1196. The memory element described in Embodiment 5 can be used as the memory element provided in the register 1196.

In the CPU illustrated in FIG. 14A, the register controller 1197 selects an operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 14B:
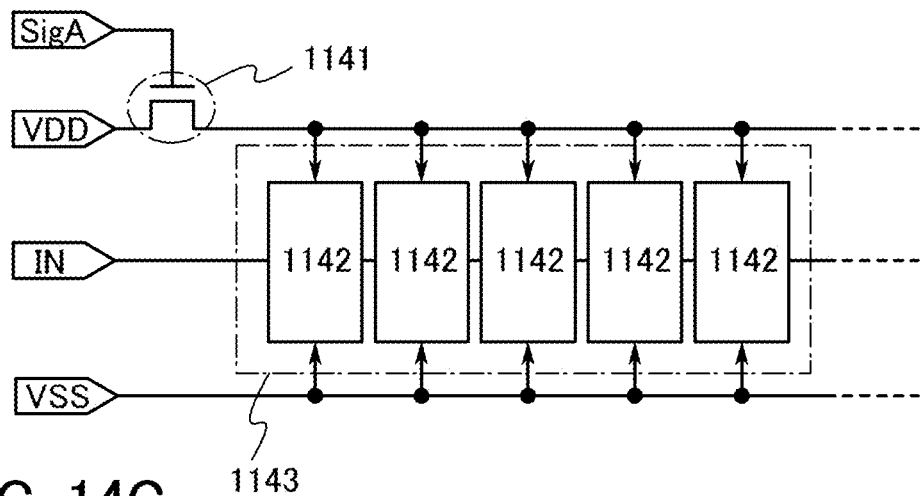
Figure 14C:
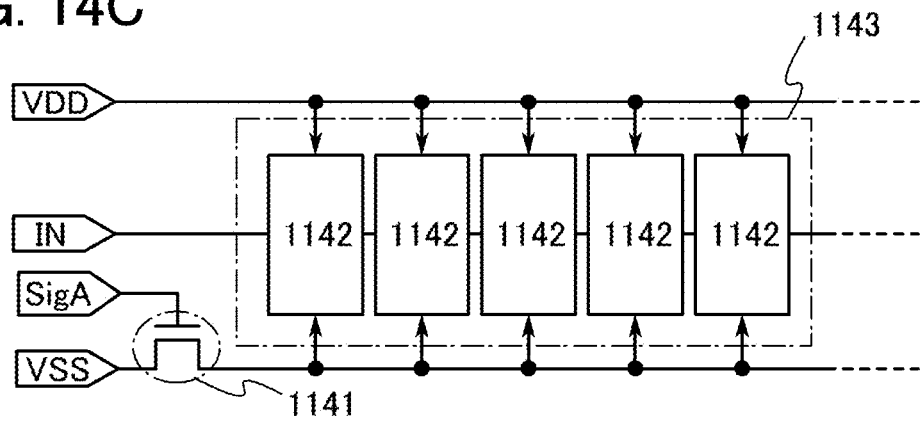

The power supply can be stopped by providing a switching element between a memory element group and a node to which a power supply potential VDD or a power supply potential VSS is supplied, as illustrated in FIG. 14B or FIG. 14C. Circuits illustrated in FIGS. 14B and 14C are described below.

FIGS. 14B and 14C each illustrate an example of a configuration of a memory circuit including a transistor including an oxide semiconductor in a channel formation region as a switching element for controlling supply of a power supply potential to a memory element.

The memory device illustrated in FIG. 14B includes a switching element 1141 and a memory element group 1143 including a plurality of memory elements 1142. Specifically, as each of the memory elements 1142, the memory element described in Embodiment 5 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 14B, a transistor including an oxide semiconductor in a channel formation region is used for the switching element 1141, and the switching of the transistor is controlled by a signal Sig A supplied to a gate electrode thereof.

Note that FIG. 14B illustrates the configuration in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 14B, the switching element 1141 may control the supply of the low-level power supply potential VSS.

In FIG. 14C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be combined as appropriate with any of the other embodiments.

EXPLANATION OF REFERENCE

100: transistor, 101: substrate, 102: base layer, 103: oxide semiconductor layer, 104: gate insulating layer, 105: gate electrode, 106: dopant, 107: insulating layer, 108: insulating layer, 109: contact hole, 111: sidewall, 112: channel protective layer, 113: insulating layer, 115: back gate electrode, 140: transistor, 150: transistor, 160: transistor, 170: transistor, 180: transistor, 190: transistor, 1100: memory cell, 1110: memory cell array, 1111: wiring driver circuit, 1112: reading circuit, 1113: wiring driver circuit, 1120: memory cell array, 1130: memory cell, 1131: transistor, 1132: capacitor, 1140: memory cell array, 1141: switching element, 1142: memory element, 1143: memory element group, 1150: memory cell, 1151: transistor, 1152: transistor, 1153: transistor, 1154: transistor, 1155: transistor, 1156: transistor, 1160: transistor, 1161: transistor, 1162: transistor, 1163: transistor, 1164: transistor, 1170: memory cell, 1171: transistor, 1172: transistor, 1173: capacitor, 1180: memory cell, 1181: transistor, 1182: transistor, 1183: capacitor, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 103*a*: source region, 103*b*: drain region, 103*c*: channel formation region, 103*d*: low-concentration region, 103*e*: low-concentration region, 105*a*: gate electrode, 105*b*: gate electrode, 110*a*: source electrode, and 110*b*: drain electrode.

This application is based on Japanese Patent Application serial no. 2010-293047 filed with Japan Patent Office on Dec. 28, 2010, the entire contents of which are hereby incorporated by reference.

The invention claimed is:

1. A semiconductor device comprising:
an oxide semiconductor layer including a channel formation region, a source region and a drain region, wherein:
the oxide semiconductor layer contains zinc, indium and gallium;
the channel formation region includes crystals;
the crystals are c-axis-oriented in a direction substantially perpendicular to a surface of the oxide semiconductor layer;
the crystals comprise atoms arranged to have a triangular or hexagonal shape in an a-b plane;
each of the source region and the drain region includes at least one element selected from Group 15 elements;
each of the source region and the drain region comprises a wurtzite crystal structure, and
a crystal structure of each of the source region and the drain region is different from a crystal structure of the channel formation region.

2. The semiconductor device according to claim 1, wherein:
a concentration of the at least one element selected from Group 15 elements included in the source region is higher than or equal to $5 \times 10^{19}$ atoms/cm$^3$ and lower than or equal to $1 \times 10^{22}$ atoms/cm$^3$; and
a concentration of the at least one element selected from Group 15 elements included in the drain region is higher than or equal to $5 \times 10^{19}$ atoms/cm$^3$ and lower than or equal to $1 \times 10^{22}$ atoms/cm$^3$.

3. The semiconductor device according to claim 1, wherein the at least one element is nitrogen.

4. The semiconductor device according to claim 1, further comprising an insulating layer under the oxide semiconductor layer, wherein:
an amount of oxygen released from the insulating layer is greater than or equal to $3.0 \times 10^{20}$ atoms/cm$^3$ in thermal desorption spectroscopy when the amount of oxygen is converted into oxygen atoms;
the insulating layer contains oxygen and is capable of supplying oxygen to the oxide semiconductor layer; and
the insulating layer contains SiO$_x$ where x is larger than 2.

5. The semiconductor device according to claim 1, further comprising a gate electrode over the oxide semiconductor layer, wherein the source region and the drain region are formed by self-aligned process with respect to the gate electrode.

6. A semiconductor device comprising:
an oxide semiconductor layer including a channel formation region, a source region and a drain region;
a source electrode electrically connected to the source region; and
a drain electrode electrically connected to the drain region,
wherein:
the channel formation region includes crystals;
the crystals are c-axis-oriented in a direction substantially perpendicular to a surface of the oxide semiconductor layer;
the crystals comprise atoms arranged to have a triangular or hexagonal shape in an a-b plane;
each of the source electrode and the drain electrode is a metal electrode;
an energy gap of the channel formation region is larger than an energy gap of each of the source region and the drain region;
the energy gap of the channel formation region is 2.5 eV or more, and a crystal structure of each of the source region and the drain region is different from a crystal structure of the channel formation region.

7. The semiconductor device according to claim 6, wherein:
each of the source region and the drain region includes at least one element selected from Group 15 elements;
a concentration of the at least one element selected from Group 15 elements included in the source region is higher than or equal to $5 \times 10^{19}$ atoms/cm$^3$ and lower than or equal to $1 \times 10^{22}$ atoms/cm$^3$; and
a concentration of the at least one element selected from Group 15 elements included in the drain region is higher than or equal to $5 \times 10^{19}$ atoms/cm$^3$ and lower than or equal to $1 \times 10^{22}$ atoms/cm$^3$.

8. The semiconductor device according to claim 7, wherein the at least one element is nitrogen.

9. The semiconductor device according to claim 6, further comprising an insulating layer under the oxide semiconductor layer, wherein:
an amount of oxygen released from the insulating layer is greater than or equal to $3.0 \times 10^{20}$ atoms/cm$^3$ in thermal desorption spectroscopy when the amount of oxygen is converted into oxygen atoms;
the insulating layer contains oxygen and is capable of supplying oxygen to the oxide semiconductor layer; and
the insulating layer contains SiO$_x$, where x is larger than 2.

10. The semiconductor device according to claim 6, further comprising a gate electrode over the oxide semiconductor layer, wherein the source region and the drain region are formed by self-aligned process with respect to the gate electrode.

11. The semiconductor device according to claim 6, wherein:
a work function of the channel formation region is larger than a work function of the source region; and
the work function of the source region is larger than a work function of the source electrode.

12. The semiconductor device according to claim 6, wherein the energy gap of the channel formation region is 3 eV or more.

13. The semiconductor device according to claim 6, wherein:
the crystals include a first crystal and a second crystal; and
directions of an a-axis and a b-axis on the a-b plane of the first crystal are different from those of the second crystal.

14. A semiconductor device comprising:
an oxide semiconductor layer including a channel formation region, a source region and a drain region,
wherein:
the oxide semiconductor layer contains zinc, indium and gallium;
the channel formation region includes crystals;
the crystals are c-axis-oriented in a direction substantially perpendicular to a surface of the oxide semiconductor layer;
the crystals comprise atoms arranged to have a triangular or hexagonal shape in an a-b plane;
each of the source region and the drain region includes at least one element selected from Group 15 elements;
each of the source region and the drain region comprises a wurtzite crystal structure;

an energy gap of the channel formation region is larger than an energy gap of each of the source region and the drain region;

the energy gap of the channel formation region is 2.5 eV or more, and a crystal structure of each of the source region and the drain region is different from a crystal structure of the channel formation region.

15. The semiconductor device according to claim 14, wherein:

a concentration of the at least one element selected from Group 15 elements included in the source region is higher than or equal to $5 \times 10^{19}$ atoms/cm$^3$ and lower than or equal to $1 \times 10^{22}$ atoms/cm$^3$; and a concentration of the at least one element selected from Group 15 elements included in the drain region is higher than or equal to $5 \times 10^{19}$ atoms/cm$^3$ and lower than or equal to $1 \times 10^{22}$ atoms/cm$^3$.

16. The semiconductor device according to claim 14, wherein the at least one element is nitrogen.

17. The semiconductor device according to claim 14, further comprising an insulating layer under the oxide semiconductor layer, wherein:

an amount of oxygen released from the insulating layer is greater than or equal to $3.0 \times 10^{20}$ atoms/cm$^3$ in thermal desorption spectroscopy when the amount of oxygen is converted into oxygen atoms;

the insulating layer contains oxygen and is capable of supplying oxygen to the oxide semiconductor layer; and the insulating layer contains SiO$_x$ where x is larger than 2.

18. The semiconductor device according to claim 14, further comprising a gate electrode over the oxide semiconductor layer, wherein the source region and the drain region are formed by self-aligned process with respect to the gate electrode.

19. The semiconductor device according to claim 14, further comprising a source electrode electrically connected to the source region, wherein:

a work function of the channel formation region is larger than a work function of the source region; and the work function of the source region is larger than a work function of the source electrode.

20. The semiconductor device according to claim 14, wherein the energy gap of the channel formation region is 3 eV or more.

* * * * *